(12) United States Patent
Maeda

(10) Patent No.: US 7,130,109 B2
(45) Date of Patent: Oct. 31, 2006

(54) OPTICAL SIGNAL AMPLIFICATION DEVICE

(75) Inventor: Yoshinobu Maeda, Yokkaichi (JP)

(73) Assignee: Optotriode Co., Ltd., Nagoya (JP)

( * ) Notice: Subject to any disclaimer, the term of this patent is extended or adjusted under 35 U.S.C. 154(b) by 70 days.

(21) Appl. No.: 10/508,672

(22) PCT Filed: Jul. 12, 2004

(86) PCT No.: PCT/JP2004/010257

§ 371 (c)(1),
(2), (4) Date: Oct. 7, 2004

(87) PCT Pub. No.: WO2006/006249

PCT Pub. Date: Jan. 19, 2006

(65) Prior Publication Data

US 2006/0087721 A1    Apr. 27, 2006

(51) Int. Cl.
  H01S 3/00   (2006.01)
  H01S 5/00   (2006.01)
  H04B 10/12  (2006.01)

(52) U.S. Cl. .................. 359/337; 359/259; 359/330; 398/175

(58) Field of Classification Search ........... 359/259, 359/330, 337; 398/175
See application file for complete search history.

(56) References Cited

U.S. PATENT DOCUMENTS

| | | | | |
|---|---|---|---|---|
| 5,679,808 A * | 10/1997 | Mizoguchi et al. | ......... | 552/223 |
| 6,259,552 B1 * | 7/2001 | Boffi et al. | .................. | 359/332 |
| 6,353,498 B1 * | 3/2002 | Maeda | .................... | 359/341.1 |
| 6,753,996 B1 * | 6/2004 | Shibata et al. | .............. | 359/279 |
| 6,766,072 B1 * | 7/2004 | Marazzi et al. | ................ | 385/14 |
| 6,947,206 B1 * | 9/2005 | Tsadka et al. | .............. | 359/333 |
| 2003/0174393 A1 * | 9/2003 | Maeda et al. | ................ | 359/344 |

(Continued)

FOREIGN PATENT DOCUMENTS

JP   2001-272707   10/2001

(Continued)

OTHER PUBLICATIONS

Sun, J., "Relaxation of facet reflection restriction in XGM wavelength converters", Optics Communications, vol. 206, May 15, 2002, pp. 67-75.*

(Continued)

*Primary Examiner*—Jack Keith
*Assistant Examiner*—Eric Bolda
(74) *Attorney, Agent, or Firm*—Oliff & Berridge, PLC

(57) ABSTRACT

An optical signal amplification device for outputting an output signal light which has the same wavelength as an input signal light and an intensity variation identical in phase with an intensity variation of the input signal light. The device includes: (a) an amplifying element having a cross gain modulation function of outputting an output light including (i) the output signal light and (ii) a neighboring light which has a neighboring wavelength different from the wavelength of the output signal light and an intensity variation inverted in phase with respect to the intensity variation of the output signal light; (b) inputting means for inputting the input signal light to the amplifying element; (c) a selecting element extracting the output signal light and at least a part of the neighboring light from the output light, such that the extracted output signal light and neighboring light are separated from each other; and (d) feedback means for feeding back the neighboring light extracted by the selecting element, to the amplifying element, so that the neighboring light is inputted to the amplifying element, for rendering the amplifying element to generate a negative feedback amplification effect.

16 Claims, 14 Drawing Sheets

U.S. PATENT DOCUMENTS

2004/0109690 A1* 6/2004 Maeda ................... 398/83
2005/0012985 A1* 1/2005 Tsadka et al. ........... 359/333
2006/0008203 A1* 1/2006 Maeda ................... 385/27

FOREIGN PATENT DOCUMENTS

WO    WO 02/061502 A1    8/2002
WO    WO 02/86616 A1    10/2002

OTHER PUBLICATIONS

Maeda, Y., "Negative feedback optical amplification effect based on cross-gain modulation in semiconductor optical amplifiers", Applied Physics Letters, vol. 88, pp. 101108-1 to 101108-3, Mar. 8, 2006.*

Sun, Junqiang, "Relaxation of Facet Reflection Restrication Restriction in XGM Wavelength Convertors", Optics Communications 206, pp. 67-75, Department of Optoelectronic Engineering, Huazhong University of Science and Technology, People's Republic of China, 2002.

Nesset, Derek et al., "All-Optical Wavelength Conversion Using SOA Nonlinearities", BT Laboratories, pp. 56-61, IEEE Communications Magazine, Dec. 1998.

* cited by examiner

OPTICAL SIGNAL AMPLIFICATION DEVICE

TECHNICAL FIELD

The present invention relates to an optical signal amplification device suitable for optoelectronics such as optical communication, optical image processing, optical computation and optical measurement, which require advanced optical signal processing.

BACKGROUND ART

Conventionally, an erbium-doped fiber amplifier (EDFA) and a semiconductor optical amplifier (SOA) are used for amplifying a light signal. Actually, however, for eliminating noise generated in such an amplifier, the light signal that is transmitted at a high speed is once converted into an electrical signal, so as to be subjected to noise elimination and signal processing in an electronic circuitry, and the processed signal is then reconverted into a light signal to be transmitted. This incapability to achieve direct processing of a light signal without its conversion into an electrical signal limits the speed of the optical signal processing.

Therefore, in broad-band information services such as dynamic image communication and picture image distribution using fiber-optic communication capable of achieving broad-band high-speed data transmission, namely, in a field in which a large amount of information is to be processed at a high speed, there has been demanded a technique which enables a light signal to be processed without its conversion into an electrical signal. However, in a filed of optoelectronics, there have not yet realized high-performance signal amplifiers corresponding to a negative-feedback amplifier and an operational amplifier which are known in a field of electronics. That is, there is a strong demand for an advanced optical signal amplification device capable of achieving various kinds of signal processing without generating large noise.

The present inventor has proposed an optical-signal amplification triode device equipped with a function of providing an output signal light which is obtained by amplifying signal of an input signal light with use of a control light, as described in Document 1 or Document 2. The Document 1 discloses an optical control device, in which a first input light having a first wavelength, together with a second input light (bias light) having a second wavelength and a constant intensity, is inputted into a first optical amplifying element, and then an output light outputted from the first optical amplifying element, together with a control light having the first wavelength, is inputted into a second optical amplifying element, whereby an output light having been subjected to a switching control and other processing is obtained from the second optical amplifying element. Either of the first and second optical amplifying elements used in this optical control device utilizes cross gain modulation effect. The Document 2 discloses an optical function device, in which a first input light having a first wavelength, together with a second input light (bias light) having a second wavelength and a constant intensity, is inputted into a first optical amplifying element, and then an output light outputted from the first optical amplifying element, together with a control light having the first wavelength, is inputted into a second optical amplifying element. A part of an output light outputted from the second optical amplifying element is subjected to a positive feedback to an input side of the first optical amplifying element, whereby a greatly amplified output light is obtained at a high modulation factor.

[Document 1] WO 02/061502 A1
[Document 2] WO 02/086616 A1

In general, since a conventional optical amplifying element merely has a simple signal amplification function, the amplifying element disadvantageously amplifies not only the signal but also the noise. Therefore, gain, waveform and baseline of the output signal light are not stabilized in relation with the intensity and frequency of the input signal light, thereby making difficult to achieve an advanced signal processing. Further, in a case where an input signal light of an excessively high intensity is inputted to the conventional optical amplifying element, there is an inconvenience that the input signal light is further amplified and is outputted as surge light. Further, also in the above-described optical control device and optical function device, there is required an improvement such as further stabilization of the gain in the processing of the light signal.

The present invention was made in view of the above-described background circumstances. It is therefore an object of the invention to provide an advanced negative-feedback optical signal amplification device which is capable of providing an output signal light whose gain, waveform and baseline are stabilized without generating large noise, or whose intensity is suitably suppressed where an input signal light of an excessively high intensity is inputted to the optical signal amplification device.

DISCLOSURE OF INVENTION

In an optical amplifying element, such as a semiconductor optical amplifying element and a fiber amplifier doped with a rare-earth element (e.g., erbium), which has a cross gain modulation function, a spontaneous emission light which has a wavelength near a first wavelength $\lambda_1$ of an input light incident onto the optical amplifying element, has an intensity varying in response to a variation in the intensity of that input light. Characteristically, the variation in the intensity of the spontaneous emission light is inverted with respect to the variation in the signal intensity of the input light, and the spontaneous emission light as well as an output signal light is outputted from the optical amplifying element. It is common that the output signal light of the above-described first wavelength $\lambda_1$ is extracted by using a wavelength selecting element, from an output signal light outputted from the optical amplifying element, namely, is separated from the surrounding light having wavelengths other than the first wavelength $\lambda_1$, and that the surrounding light is discarded without being utilized. That is, it is common that the spontaneous emission light as the surrounding light is removed by a filter, since it becomes a factor of noise generation. In such a situation, the present inventor has made extensive studies for achieving the above-described object, and found out that a negative-feedback optical signal amplification phenomenon in which characteristics of the output light of the optical amplifying element is surprisingly drastically changed by feeding back the separated surrounding light to the optical amplifying element, so that the gain is held substantially constant while the waveform and baseline are stabilized. The present invention was made on the basis of this finding.

That is, the gist of an optical signal amplification device of a first invention is that the optical signal amplification device for outputting an output signal light which has a first wavelength that is the same as a wavelength of an input signal light and an intensity variation that is identical in phase with an intensity variation of the input signal light, the optical signal amplification device being characterized by comprising: (a) a first optical amplifying element having a cross gain modulation function of outputting the output signal light and a neighboring light which has a neighboring wavelength that is different from the wavelength of the output signal light and an intensity variation that is inverted in phase with respect to the intensity variation of the output signal light; (b) signal-light inputting means for inputting the input signal light to the first optical amplifying element; (c) a wavelength selecting element extracting the output signal light of the first wavelength and all or a part of the neighboring light of the wavelength different from the first wavelength, from an output light outputted from the first optical amplifying element, such that the output signal light and the above-described all or part of the neighboring light are separated from each other; and (d) optical feedback means for feeding back the above-described all or part of the neighboring light extracted by the wavelength selecting element, to the first optical amplifying element, so that the above-described all or part of the neighboring light is inputted to the first optical amplifying element, for rendering the first optical amplifying element to generate a negative feedback amplification effect.

The gist of a second invention is that an optical signal amplification device for outputting an output signal light which has a wavelength that is the same as a wavelength of an input signal light and an intensity variation that is identical in phase with an intensity variation of the input signal light, the optical signal amplification device being characterized by comprising: (a) a first optical amplifying element having a cross gain modulation function of outputting the output signal light and a neighboring light which has a neighboring wavelength that is different from the wavelength of the output signal light and an intensity variation that is inverted in phase with respect to the intensity variation of the output signal light; (b) signal-light inputting means for inputting the input signal light of the first wavelength to the first optical amplifying element; (c) a wavelength selecting element extracting the output signal light of the first wavelength and all or a part of the neighboring light of the wavelength different from the first wavelength, from an output light outputted from the first optical amplifying element, such that the output signal light and the above-described all or part of the neighboring light are separated from each other; (d) a second optical amplifying element amplifying the neighboring light extracted by the wavelength selecting element; and (e) optical feedback means for feeding back the neighboring light amplified by the second optical amplifying element, to the first optical amplifying element, so that the neighboring light is inputted to the first optical amplifying element, for rendering the first optical amplifying element to generate a negative feedback amplification effect.

The gist of an optical signal amplification device of a third invention is that, in the above-described first or second invention, the optical signal amplification device comprises amplification-factor controlling means for controlling an amplification factor of the output signal light by controlling an amount of the neighboring light having the intensity variation inverted in phase, which is to be fed back to the first optical amplifying element.

The gist of a fourth invention is that, in the above-described second invention, the optical signal amplification device is equipped with second input-light inputting means for inputting a second input light which has a wavelength that is different from the first wavelength, to the second optical amplifying element, for enhancing the negative feedback amplification effect of the first optical amplifying element.

The gist of a fifth invention is that, in the above-described second invention, the optical signal amplification device comprises amplification-factor controlling means for controlling an amplification factor of the optical signal amplification device by controlling an intensity of a second input light which is inputted to the second optical amplifying element.

The gist of a sixth invention is that, in the above-described first or second invention, the wavelength selecting element is constituted by one of a grating filter having a refractive index which is periodically changed in a light transmission direction, a multilayer filter consisting of a multiplicity of pairs of layers which are superposed on each other and in which each pair of layers have respective different refractive index values, and a photonic crystal filter.

The gist of a seventh invention is that, in the above-described first or second invention, the signal-light inputting means and/or the optical feedback means is constituted by an optical coupler, an optical circulator, a directional coupling element, an optical add/drop filter or a wavelength selecting element.

The gist of an eighth invention is that, in the above-described first or second invention, the first optical amplifying element and/or the second optical amplifying element is a semiconductor optical amplifying element equipped with an active layer constituted by pn junction, wherein the active layer is constituted by a bulk, a multiplex quantum well, a strained superlattice or a quantum dot.

The gist of a ninth invention is that, in the above-described first or second invention, the first optical amplifying element and/or the second optical amplifying element is a reflection-type semiconductor optical amplifying element which is equipped at an end portion thereof with reflecting means.

The gist of a tenth invention is that the first and second optical amplifying elements, and the wavelength selecting element, the signal-light inputting means and/or the optical feedback means are disposed on an optical waveguide which is formed on a monolithic semiconductor substrate.

The gist of an eleventh invention is that the optical signal amplification device constitutes a part or all of an optical operational amplifier, an optical differential amplification circuit, an optical adding/subtracting circuit, an optical differentiating/integrating circuit, an optical flip-flop circuit, an optical limiter and a light surge suppressor.

According to the optical signal amplification device of the first invention, the device is equipped with (a) a first optical amplifying element having a cross gain modulation function of outputting the output signal light and a neighboring light which has a neighboring wavelength that is different from the wavelength of the output signal light and an intensity variation that is inverted in phase with respect to the intensity variation of the output signal light; (b) signal-light inputting means for inputting the input signal light to the first optical amplifying element; (c) a wavelength selecting element extracting the output signal light of the first wavelength and all or a part of the neighboring light of the wavelength different from the first wavelength, from an output light outputted from the first optical amplifying element, such that the output signal light and the above-described all or part of the neighboring light are separated from each other; and (d) optical feedback means for feeding back the above-described all or part of the neighboring light extracted by the wavelength selecting element, to the first optical amplifying element, so that the above-described all or part of the neighboring light is inputted to the first optical amplifying element, for rendering the first optical amplifying element to generate a negative feedback amplification effect. Since the neighboring light included in the output light outputted from the first optical amplifying element has the intensity that is inverted in phase with respect to the intensity of the output signal light of the first wavelength included in the output light, the above-described all or part of the neighboring light (separated from the output light signal and inputted to the first optical amplifying element), having the intensity that is reduced with an increase in the intensity of the output signal light, is fed as a negative signal, back to the first optical amplifying element. Thus, the gain, waveform and baseline of the input signal light are favorably stabilized.

Further, according to the optical signal amplification device of the second invention, the device is equipped with (a) a first optical amplifying element having a cross gain modulation function of outputting the output signal light and a neighboring light which has a neighboring wavelength that is different from the wavelength of the output signal light and an intensity variation that is inverted in phase with respect to the intensity variation of the output signal light; (b) signal-light inputting means for inputting the input signal light of the first wavelength to the first optical amplifying element; (c) a wavelength selecting element extracting the output signal light of the first wavelength and all or a part of the neighboring light of the wavelength different from the first wavelength, from an output light outputted from the first optical amplifying element, such that the output signal light and the above-described all or part of the neighboring light are separated from each other; (d) a second optical amplifying element amplifying the neighboring light extracted by the wavelength selecting element; and (e) optical feedback means for feeding back the neighboring light amplified by the second optical amplifying element, to the first optical amplifying element, so that the neighboring light is inputted to the first optical amplifying element, for rendering the first optical amplifying element to generate a negative feedback amplification effect. Since the neighboring light included in the output light outputted from the first optical amplifying element has the intensity that is inverted in phase with respect to the intensity of the output signal light of the first wavelength included in the output light, the above-described all or part of the neighboring light (amplified by the second optical amplifying element and inputted to the first optical amplifying element), having the intensity that is reduced with an increase in the intensity of the output signal light, is fed as a negative signal, back to the first optical amplifying element. Where the intensity of the input light as a whole becomes lower, the cross gain modulation effect (which is provided by the intensity variation of the input signal light in the first optical amplifying element) is reduced, so that the intensity of the inverted signal of the neighboring light becomes lower whereby the negative feedback effect is reduced. However, according to the present second invention, the lowered intensity of the inverted signal of the neighboring light is amplified by the second optical amplifying element, whereby the negative feedback amplification effect is enhanced. That is, even where the intensity of the input light is low, the negative feedback effect can be stabilized owing to the second optical amplifying element which amplifies the lowered intensity of the inverted signal of the neighboring light. Further, since the device remarkably exhibits a characteristic that the gain becomes smaller as the intensity of the input signal light of the first wavelength becomes larger, it is possible to obtain a suitably suppressed output signal light where an input signal light of an excessively high intensity is inputted to the device.

Further, according to the optical signal amplification device of the third invention, in the above-described first or second invention, the amplification-factor controlling means is provided for controlling an amplification factor of the output signal light by controlling an amount of the neighboring light having the intensity variation inverted in phase, which is to be fed back to the first optical amplifying element. The provision of the amplification-factor controlling means permits a desired amplification factor to be established depending upon the purpose and characteristics of an optical circuit.

Further, according to the optical signal amplification device of the fourth invention, in the above-described second invention, the second input-light inputting means is provided for inputting a second input light which has a wavelength that is different from the first wavelength, to the second optical amplifying element, whereby the negative feedback amplification effect of the first optical amplifying element is enhanced, and accordingly the gain, waveform and baseline of the input signal light are further favorably stabilized.

Further, according to the optical signal amplification device of the fifth invention, in the above-described second invention, the amplification-factor controlling means is provided for controlling an amplification factor of the optical signal amplification device by controlling an intensity of a second input light which is inputted to the second optical amplifying element. The provision of the amplification-factor controlling means permits a desired amplification factor to be rapidly controlled or established depending upon the purpose and characteristics of an optical circuit.

Further, according to the optical signal amplification device of the sixth invention, in the above-described first or second invention, the wavelength selecting element is constituted by one of a grating filter having a refractive index which is periodically changed in a light transmission direction, a multilayer filter consisting of a multiplicity of pairs of layers which are superposed on each other and in which each pair of layers have respective different refractive index values, and a photonic crystal filter. The optical signal amplification device of the sixth invention can be constituted by a semiconductor so as to be easily made compact in size or integrated into a single chip.

Further, the gist of the seventh invention is that, in the above-described first or second invention, the signal-light inputting means and/or the optical feedback means is constituted by an optical coupler, an optical circulator, a directional coupling element, an optical add/drop filter or a wavelength selecting element. The seventh invention provides an advantage that the optical signal amplification device can be easily made compact in size. Further, where the optical add/drop filter is used, there is provided an advantage that the output signal light and the neighboring light are efficiently separated from each other and are simultaneously outputted through respective optical fibers.

Further, the gist of the eighth invention is that, in the above-described first or second invention, the first optical amplifying element and/or the second optical amplifying element is a semiconductor optical amplifying element equipped with an active layer constituted by pn junction, wherein the active layer is constituted by a bulk, a multiplex quantum well, a strained superlattice or a quantum dot. The optical signal amplification device of the eighth invention can be constituted by a semiconductor so as to be easily made compact in size or integrated into a single chip. Where the multiplex quantum well or quantum dot is used, a high-speed switching capacity of the optical signal amplification device is increased. Where the strained superlattice is used, an optical polarization dependence of the optical signal amplification device is reduced.

Further, the gist of the ninth invention is that, in the above-described first or second invention, the first optical amplifying element and/or the second optical amplifying element is a reflection-type semiconductor optical amplifying element which is equipped at an end portion thereof with reflecting means, so that the signal processing is achieved with high efficiency.

Further, the gist of the tenth invention is that the first and second optical amplifying elements, and the wavelength selecting element, the signal-light inputting means and/or the optical feedback means are disposed on an optical waveguide which is formed on a monolithic semiconductor substrate. The optical signal amplification device of the tenth invention can be constituted by a semiconductor so as to be easily made compact in size or integrated into a single chip.

The gist of an eleventh invention is that the optical signal amplification device constitutes a part or all of an optical operational amplifier, an optical differential amplification circuit, an optical adding/subtracting circuit, an optical differentiating/integrating circuit, an optical flip-flop circuit, an optical limiter and a light surge suppressor. The optical signal amplification device of the eleventh invention provides a high flexibility in various kinds of optical circuits.

The optical amplifying element constituting the optical signal amplification device is preferably provided by the semiconductor optical amplifying element equipped with an active layer which is constituted by pn junction. However, the optical amplifying element does not have to be necessarily provided by the semiconductor optical amplifying element, but may be provided by a fiber amplifier doped with a rare-earth element such as erbium, as long as the optical amplifying element has the cross gain modulation effect. For example, upon incidence of a laser light of the first wavelength onto the optical amplifying element, the amplifying element amplifies and outputs the laser light, and at the same time outputs also a spontaneous light which has a neighboring wavelength whose center corresponds to the first wavelength and which has an intensity increased or reduced in inverse proportion to modulation of the intensity of the laser light. The above-described cross gain modulation effect is interpreted to mean a phenomenon that, where a laser light having a constant intensity and a second wavelength corresponding to the wavelength of the above-described spontaneous light is inputted to the optical amplifying element, it is possible to obtain an output light of the second wavelength which is modulated inversely with respect to the above-described laser light of the first wavelength.

In the optical amplification element having the cross gain modulation function, the above-described neighboring light is a light which is generated within a wavelength band whose center corresponds to the first wavelength of the input signal light, or within a wavelength band neighboring the first wavelength, and which is modulated such that its intensity is inverted in phase with respect to the intensity of the output signal light of the first wavelength. The wavelength selecting element may be adapted to extract either all or a part of the neighboring light from the output light outputted from the first optical amplifying element, as long as it permits all or the part of the neighboring light to be negatively fed back to the first optical amplifying element.

It is noted that the second optical amplifying element functions only as an optical amplifying element and does not exhibit the cross gain modulation effect. This is also one of main characteristics of the present invention which is different from the prior art.

BEST MODE FOR CARRYING OUT THE INVENTION

Embodiment 1

Figure 1:
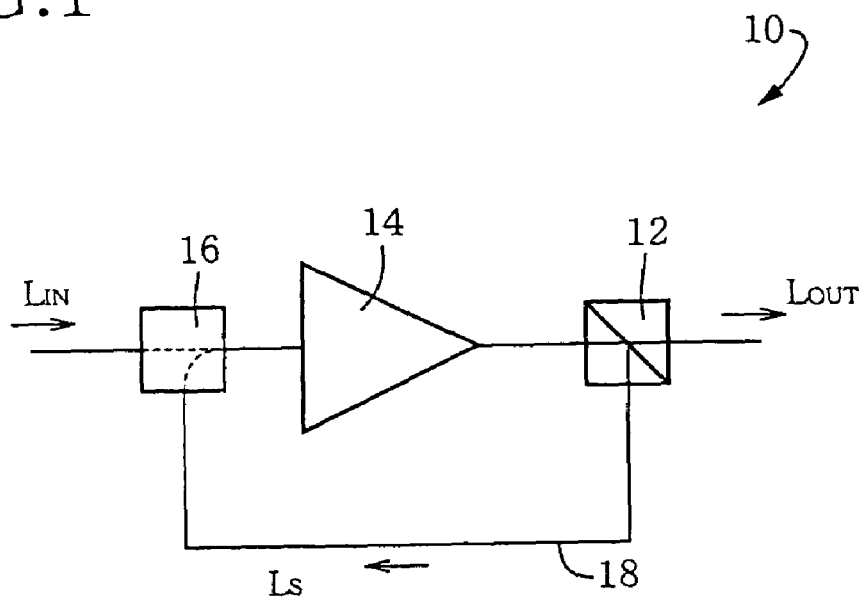
FIG. 1 is a block diagram explaining a circuit arrangement of an one-step type optical signal amplification device according to one embodiment of the present invention.

Referring to the drawings, there will be described in detail an optical signal amplification device 10 of one embodiment of the present invention which is equipped with a negative feedback amplification function.

In FIG. 1, there is shown a wavelength selecting element 12, which is provided to extract, from an output light outputted from a first optical amplifying element 14, an output signal light $L_{OUT}$ of a first wavelength $\lambda_1$ of, for example, 1550 nm and a neighboring light $L_S$ having a wavelength other than the first wavelength $\lambda_1$. That is, the wavelength selecting element 12 renders the light having a predetermined wavelength of 1545–1555 nm (whose central value is 1550 nm) to be transmitted therethrough, while reflecting all or a part of the light having a wavelength $\lambda_S$ (i.e., a predetermined wavelength band corresponding to a range of $\lambda_S<1545$ nm or $\lambda_S>1555$ nm) that is other than the above-described predetermined wavelength. This wavelength selecting element 12 may be constituted by an optical add/drop filter, which renders the light of the above-described predetermined wavelength of 1545–1555 nm, to be transmitted therethrough, and which reflects all of the light of the wavelength $\lambda_S$ so as to output it to an optical feedback path 18 which consists of an optical fiber. However, the wavelength selecting element 12 may be constituted also by either a multi-layered filter, a grating filter or a photonic crystal filter. The multilayer filter consists of a multiplicity of pairs of layers which are superposed on each other and in which each pair of layers have respective different refractive index values. The grating filter has a refractive index which is periodically changed in its light transmission direction.

An optical coupler 16 functions as signal light (first) inputting means for inputting an input signal light $L_{IN}$ to the first optical amplifying element 14. That is, the input signal light $L_{IN}$ of the first wavelength $\lambda_1$, provided by a modulated laser light which has been generated by a laser light source (not shown) and then transferred through a signal transfer path, inputted to the first optical amplifying element 14 through the optical coupler 16. The optical coupler 16 is constituted by, for example, a coupler or a branching filter which is provided by an optical fiber, or alternatively constituted by a half mirror. The optical coupler 16 may be replaced by an optical add/drop filter, which selectively reflects the above-described input signal light $L_{IN}$ of the first wavelength $\lambda_1$ while permitting transmission of the light of the wavelength $\lambda_S$ that is other than the first wavelength $\lambda_1$. It is noted that the above-described wavelength selecting element 12, first optical amplifying element 14 and optical coupler 16 are interconnected via light transfer paths, each constituted, for example, by an optical waveguide which transmits a light while confining the light in its thickness direction, or by an optical fiber which transmits a light while confining the light in its radial direction.

Figure 2:
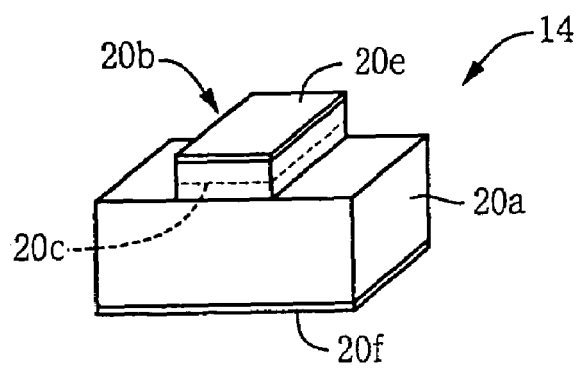
FIG. 2 is a perspective view showing appearance of an optical amplifying element which constitutes the optical signal amplification device of the embodiment of FIG. 1, where the optical amplifying element is provided by a semi-conductor optical amplifying element.

The above-described first optical amplifying element 14 is constituted, for example, by a semiconductor optical amplifier (SOA) as shown in FIG. 2. In FIG. 2, there is shown an optical waveguide 20b, which is formed on a semiconductor substrate 20a constituted by a compound semiconductor such as indium phosphide (InP). The optical waveguide 20b is provided by a multiplicity of layers of group III–V alloy semiconductor which is epitaxially grown on the semiconductor substrate 20a. The optical waveguide 20b is formed, for example, by using photolithography, to take the form of a tape-like protrusion having a predetermined width. This optical waveguide 20b, which is made of a material whose refractive index is higher than that of the semiconductor substrate 20a, is equipped with a function of transmitting a light while confining the light in its thickness direction. The multi-layered optical waveguide 20b includes a cap layer and an active layer 20c which provides a pn-junction portion, and underlies an upper electrode 20e which is fixed onto the optical waveguide 20b. With application of a voltage between the upper electrode 20e and a lower electrode 20f that is fixed onto a lower surface of the semiconductor substrate 20a, an electric current flows through the pn-junction portion provided by the active layer 20c. As a result of the flow of the electric current through the active layer 20c, electron-hole pairs are formed, whereby a light transmitted through the active layer 20a is amplified by an induced radiation effect. The active layer 20c is constituted by a bulk, a multiplex quantum well, a strained superlattice or a quantum dot. Where the active layer 20c is constituted by the multiplex quantum well, it is constituted by six pairs of InGaAs (100 Å thick) and InGaAsP (100 Å thick) which are epitaxially grown on the InP semiconductor substrate 20a and which are lattice-matched with each other. On the active layer 20c, there is formed a guide layer (2000 Å thick) of GRIN structure whose composition (refractive index) changes in steps. This active layer 20c has a device length (length of the optical waveguide) of 600 μm. The active layer 20c is considered to amplify a light passing therethrough, owing to generation of an optical energy from electrons excited by energy injection by application of an electric current of 250 mA, when the electrons are moved to a valence band by induced radiation by photons passing through the active layer 20c. The energy injection by application of the electric current of 250 mA to each first optical amplifying element 14 provides a gain of about 20 dB, for example, at the wavelength of 1550 nm.

Figure 3:
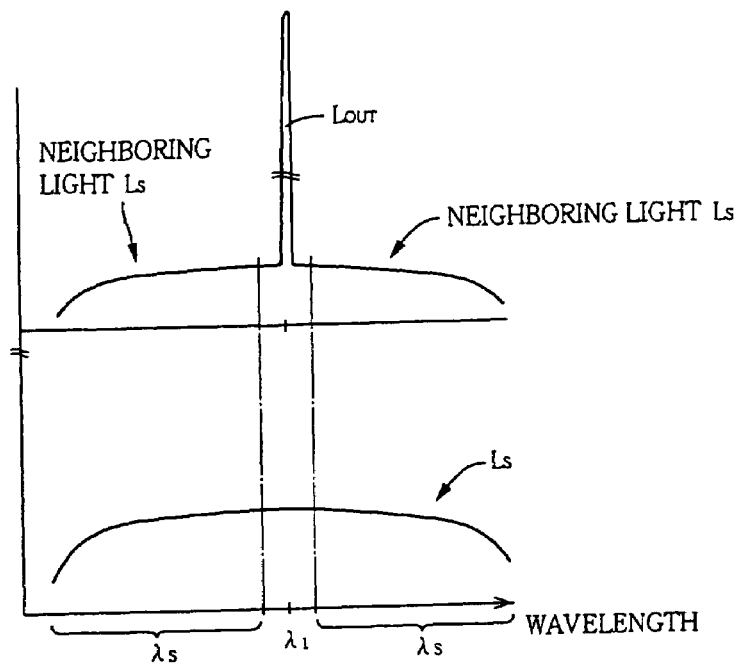
FIG. 3 is a view showing spectra of outputs from the first optical amplifying element in the optical signal amplification device of FIG. 1, wherein an upper part of the view indicates an output signal light when an input signal light is in its ON state, while a lower part of the view indicates the output signal light when the input signal light is in its OFF state.

The above-described first optical amplifying element 14 provides a so-called cross gain modulation effect. Owing to the cross gain modulation effect, upon incidence of a laser light of a predetermined wavelength onto the first optical amplifying element 14, the amplifying element 14 amplifies and outputs the laser light, and at the same time outputs also a spontaneous light which has a neighboring wavelength whose center corresponds to the predetermined wavelength and which has an intensity increased or reduced in inverse proportion to modulation of the intensity of the laser light. That is, as a result of the incidence of the input signal light $L_{IN}$ of the first wavelength $\lambda_1$ onto the amplifying element 14, the amplifying element 14 outputs a light including the output signal light $L_{OUT}$ of the first wavelength $\lambda_1$ and the neighboring light $L_S$ having a second wavelength $\lambda_2$, i.e., a neighboring wavelength that is other than the first wavelength $\lambda_1$, as shown in FIG. 3. The upper part of FIG. 3 indicates a spectrum of the output light when the input signal light $L_{IN}$ is in its ON state, while the lower part of FIG. 3 indicates a spectrum of the output light when the input signal light $L_{IN}$ is in its OFF state. The output signal light $L_{OUT}$ of the first wavelength $\lambda_1$ and the neighboring light $L_S$ having the second wavelength $\lambda_2$, which are contained in the output light outputted from the first optical amplifying element 14, have respective intensities which are inverted in phase with respect to each other. All or a part of the neighboring light $L_S$, which is extracted by the above-described wavelength selecting element 12, is guided by the optical feedback path 18 constituted by the optical fiber or the like, to the optical coupler 16. The above-described all or part of the neighboring light $L_S$ is coupled with the input signal light $L_{IN}$ in the optical coupler 16, and is then inputted to the first optical amplifying element 14. In the present embodiment, the optical feedback path 18 corresponds to optical feedback means or second inputting means for permitting the above-described all or part of the neighboring light $L_S$ to be inputted to the first optical amplifying element 14.

Figure 4:
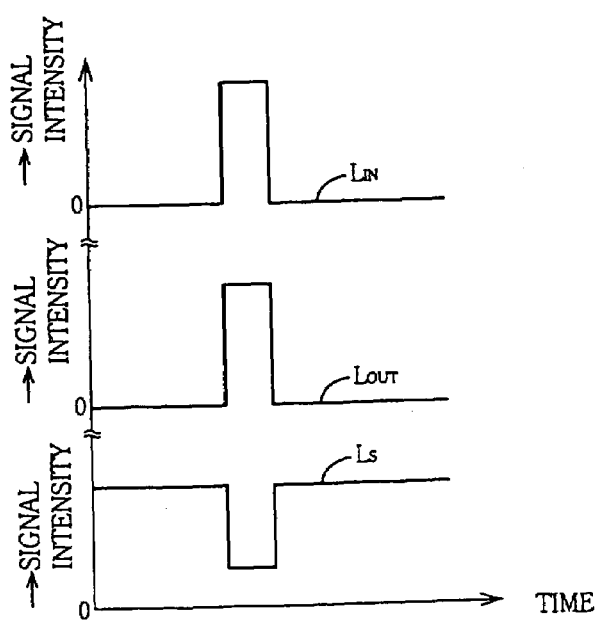
FIG. 4 is a time chart showing waveforms of the input and output signal of the optical signal amplification device of the embodiment of FIG. 1.

Therefore, in the above-described optical signal amplification device 10 in which the neighboring light $L_S$ (having the neighboring wavelength, i.e., the second wavelength $\lambda_2$) included in the output light is inputted together with the input signal light $L_{IN}$ through the optical coupler 16, the gain of the input signal light $L_{IN}$ of the first wavelength $\lambda_1$ is stabilized owing to substantially the same effect as a negative feedback effect which is known in the filed of electronics, since the light intensities of the input signal light $L_{IN}$ and the neighboring light $L_S$ are inverted with respect to each other. As a result, as shown in the time chart of FIG. 4, the output signal light $L_{OUT}$ of the first wavelength $\lambda_1$ having a signal amplification factor of about one (0 dB) is outputted. That is, since it is possible to obtain a negative-feedback amplification effect provided by only the optical signal, the gain, waveform and baseline of the output signal light $L_{OUT}$ are stabilized over a wide range of frequency, as shown in FIGS. 7–12 which will be described below. Therefore, the optical signal amplification device 10 of the present embodiment is capable of constituting an optical operational amplifier, an optical differential amplification circuit, an optical adding/subtracting circuit and an optical differentiating/integrating circuit, by utilizing the negative feedback effect stabilizing the output signal light $L_{OUT}$.

An operational amplifier of the filed of electronics has two input terminals consisting of a non-inverting input terminal and a inverting input terminal, and is used as a negative feedback circuit for feeding a part of an output voltage of an amplifying element, back to the input terminal through an external resistance. The operational amplifier is referred to as a non-inverting amplifier where a sine wave of an output is identical in phase with a sine wave of an input, and is referred to as a inverting amplifier where the sine wave of the output is offset by 180° in phase from the sine wave of the input. The optical signal amplification device 10 of the present embodiment is physically considered as a non-inverting amplifier of optical version, since the input and the output are identical in phase with each other in the device 10. In the non-inverting amplifier of the electronics field providing a voltage gain of not lower than one, the gain is one where the resistance in the feedback path is zero, namely, where the feedback path is provided by a short circuit. As is understood in view of the origin of the term, the operational amplifier is capable of very accurately achieving an analog computing such as adding, subtracting, differentiating and integrating. It is therefore no exaggeration to say that the operational amplifier takes charge of a major part of an analog electronic circuit today. The optical signal amplification device 10 of the present embodiment can take charge of an important role in an optical circuit, as the operational amplifier in the electronics field.

Embodiment 2

Next, there will be described other embodiments of the present invention. In the following embodiments, the same reference signs as used in the above-described embodiment will be used to identify the common parts, and description of these parts will not be provided.

Figure 5:
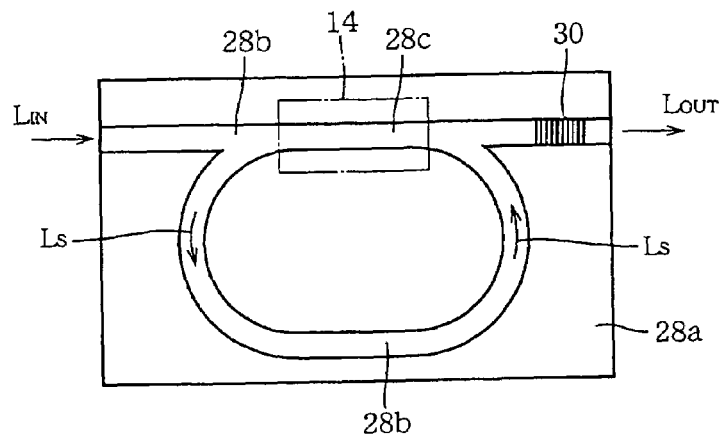
FIG. 5 is a view explaining another example in which the optical signal amplification device of the embodiment of FIG. 1 is monolithically integrated into a monolithic semi-conductor.

FIG. 5 shows a monolithic arrangement as another example in which the above-described optical signal amplification device 10 is mounted on a single semiconductor chip. In FIG. 5, on a semiconductor substrate 28a, there is formed a waveguide 28b, which consists of a straight portion and an elliptic portion that overlaps with a central part of the straight portion so as to be connected with the straight portion. An upper electrode 28c is provided in a portion of the waveguide 28b, which portion corresponds to the central part of the straight portion and a part of the elliptic portion, so as to function as the above-described first optical amplifying element 14. A wavelength selecting element 30, having a refractive index which is periodically changed, is provided in the output side part of the straight portion of the waveguide 28b. Like the above-described wavelength selecting element 12, the wavelength selecting element 30 extracts an output signal light $L_{OUT}$ of a first wavelength $\lambda_1$ (e.g., 1550 nm) and a neighboring light $L_S$ of a wavelength other than the first wavelength $\lambda_1$, from an output light outputted from the first optical amplifying element 14, and then permits the output signal light $L_{OUT}$ to be transmitted therethrough, while reflecting the neighboring light $L_S$. The reflected neighboring light $L_S$ is fed back toward the first optical amplifying element 14, i.e., the input side, so as to be circulated in the elliptic portion of the waveguide 28b. In the present embodiment, the straight portion of the waveguide 28b functions as signal light inputting means (first inputting means) for inputting the input signal light $L_{IN}$ to the first optical amplifying element 14, while the elliptic portion of the waveguide 28b functions as optical feedback means (second inputting means) for rendering the neighboring light $L_S$ which has been separated by the wavelength selecting element 30, to be fed back to be inputted to the first optical amplifying element 14.

Embodiment 3

Figure 6:
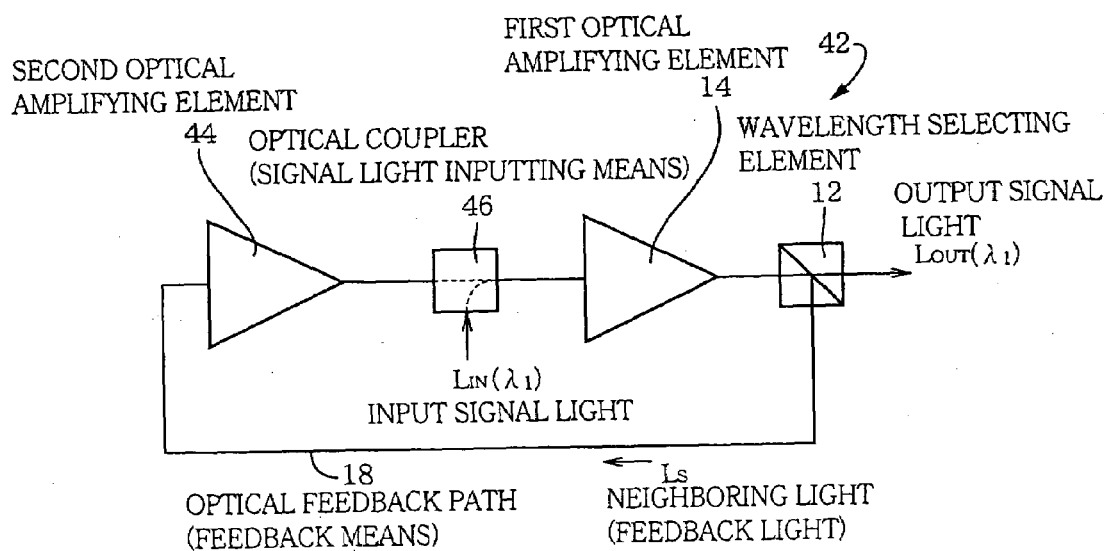
FIG. 6 is a block diagram corresponding to the block diagram of FIG. 1, and explaining a circuit arrangement of a two-step-type optical signal amplification device according to another embodiment of the present invention.

FIG. 6 is a view explaining the construction of an optical signal amplification device 42 of another embodiment of the present invention. In FIG. 6, the neighboring light $L_S$, which has been separated by the wavelength selecting element 12, is inputted to a second optical amplifying element 44 via the optical feedback path 18. The neighboring light $L_S$ is amplified in the second optical amplifying element 44, and is then coupled with the input signal light $L_{IN}$ in an optical coupler 46, so that the neighboring light $L_S$, together with the input signal light $L_{IN}$, is inputted to the first optical amplifying element 14. Unlike the wavelength selecting element 12, the optical coupler 46 does not have to be provided by a filter, as long as it is capable of coupling the output light of the second optical amplifying element 44 and the input signal light $L_{IN}$ with each other. However, the optical coupler 46 may be provided by the above-described optical add/drop filter or the like. As described above, all or a part of the neighboring light $L_S$ included in the output light of the first optical amplifying element 14 has an intensity inverted with respect to that of the output signal light $L_{OUT}$ of the first wavelength $\lambda_1$ included in the output light of the first optical amplifying element 14. Further, since the above-described all or part of the neighboring light $L_S$ is amplified by the second optical amplifying element 44 before it is inputted to the first optical amplifying element 14, the negative feedback effect is enhanced whereby the gain, waveform and baseline of the output signal light $L_{OUT}$ are stabilized. That is, noise reduction is thus achieved. Further, since there is provided a characteristic that the gain is reduced with an increase in the intensity of the input signal light $L_{IN}$ of the first wavelength $\lambda_1$, it is possible to obtain an output signal light having a suppressed intensity even where an input signal light $L_{IN}$ having an excessively high intensity is inputted to the optical signal amplification device 42. In the present embodiment, the optical coupler 46 functions as signal light inputting means (first inputting means) for inputting the input signal light $L_{IN}$ to the first optical amplifying element 14, while the optical feedback path 18 functions as optical feedback means (second inputting means) for rendering all or a part of the neighboring light $L_S$ to be fed back to be inputted to the second optical amplifying element 44.

Figure 7:
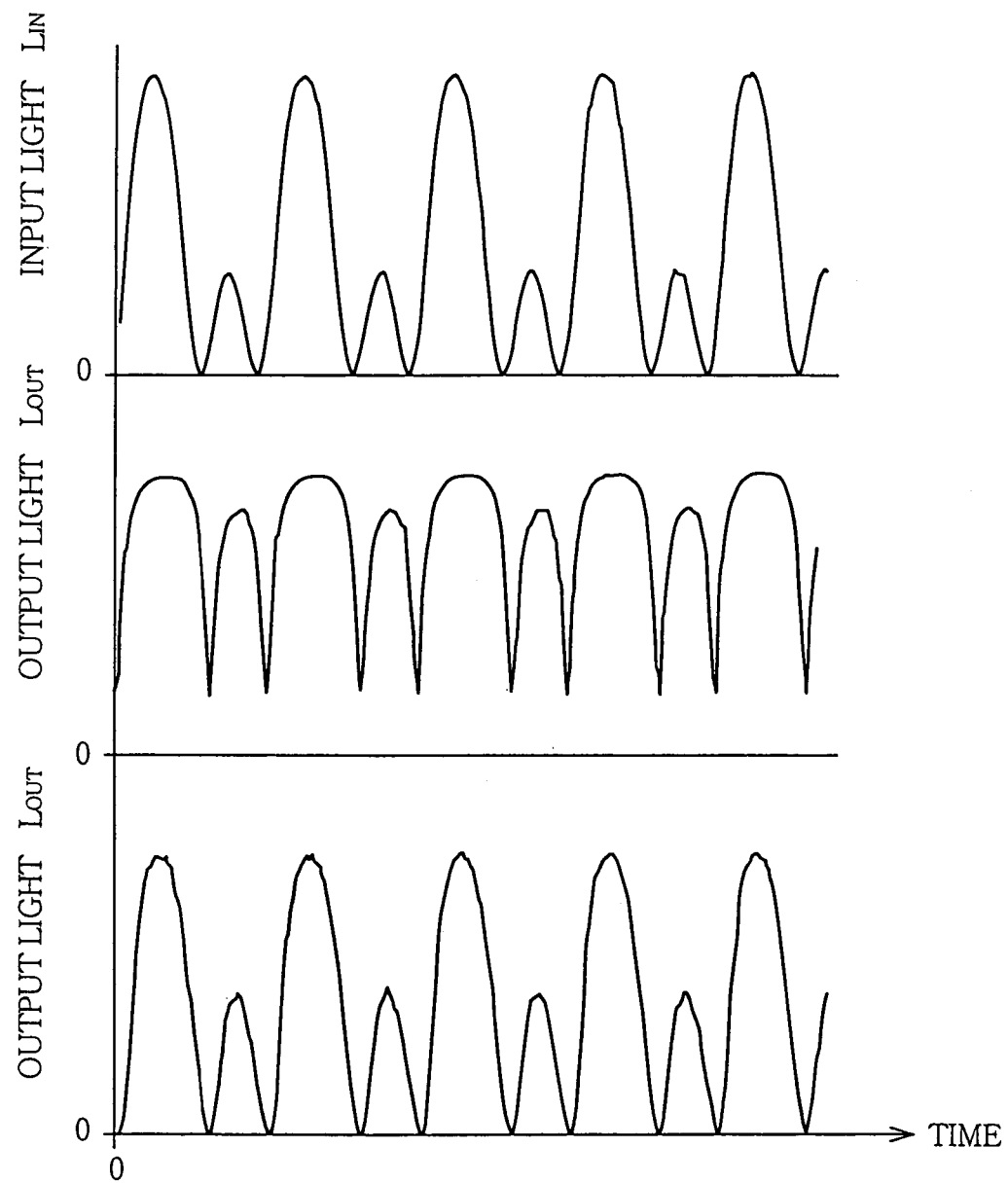
FIG. 7 is a view explaining an amplification operation for amplifying an input signal light of 0.1 GHz, wherein an upper part of the view indicates a waveform of the input signal light, a middle part of the view indicates a waveform of an output signal light from an one-step-type optical signal amplification device without a negative feedback arrangement, and a lower part of the view indicates a waveform of an output signal light from the optical signal amplification device of the embodiment of FIG. 6 with a negative feedback arrangement.
Figure 8:
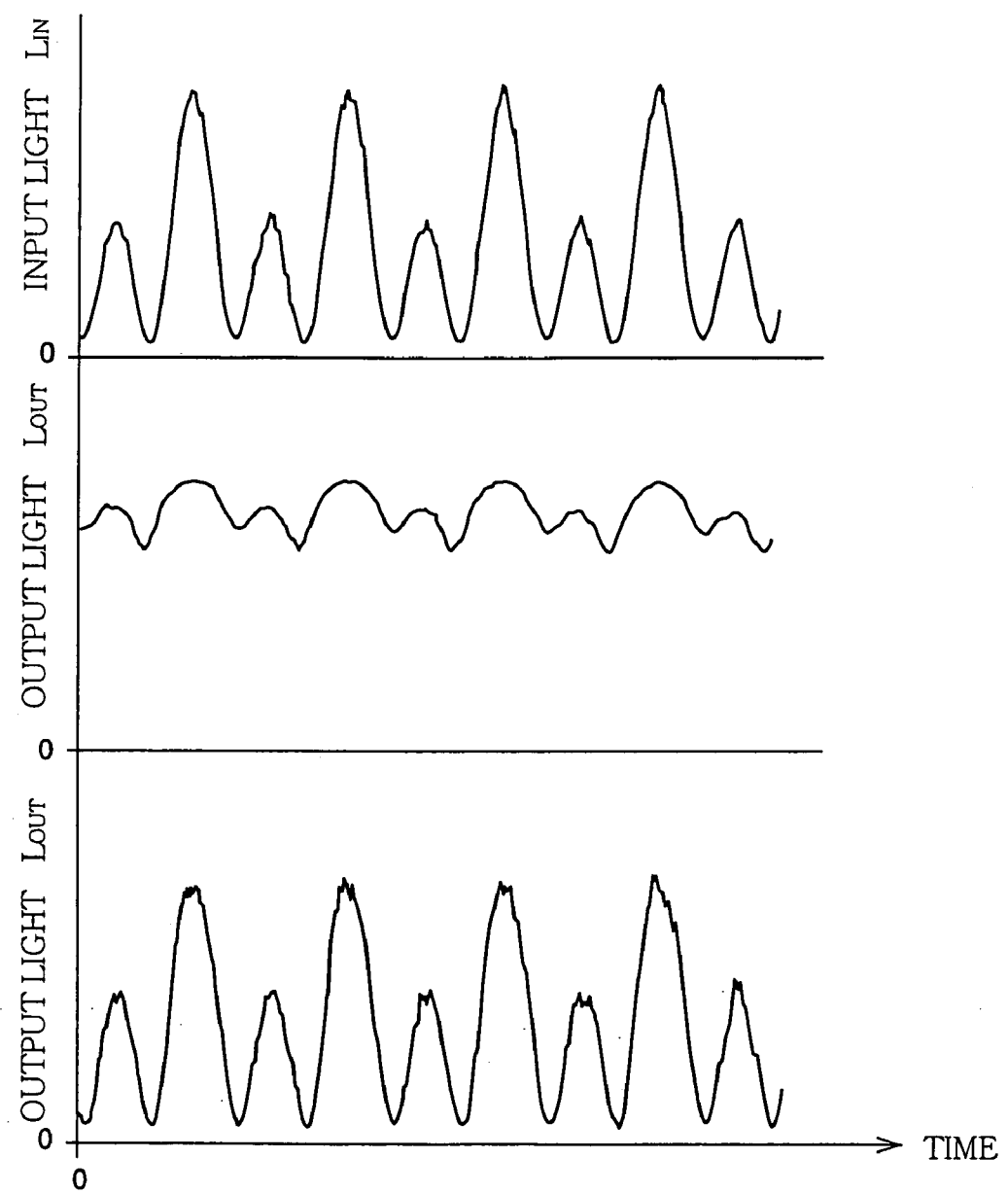
FIG. 8 is a view explaining an amplification operation for amplifying an input signal light of 1 GHz, a middle part of the view indicates a waveform of an output signal light from the one-step-type optical signal amplification device without a negative feedback arrangement, and a lower part of the view indicates a waveform of an output signal light from the optical signal amplification device of the embodiment of FIG. 6 with a negative feedback arrangement.
Figure 9:
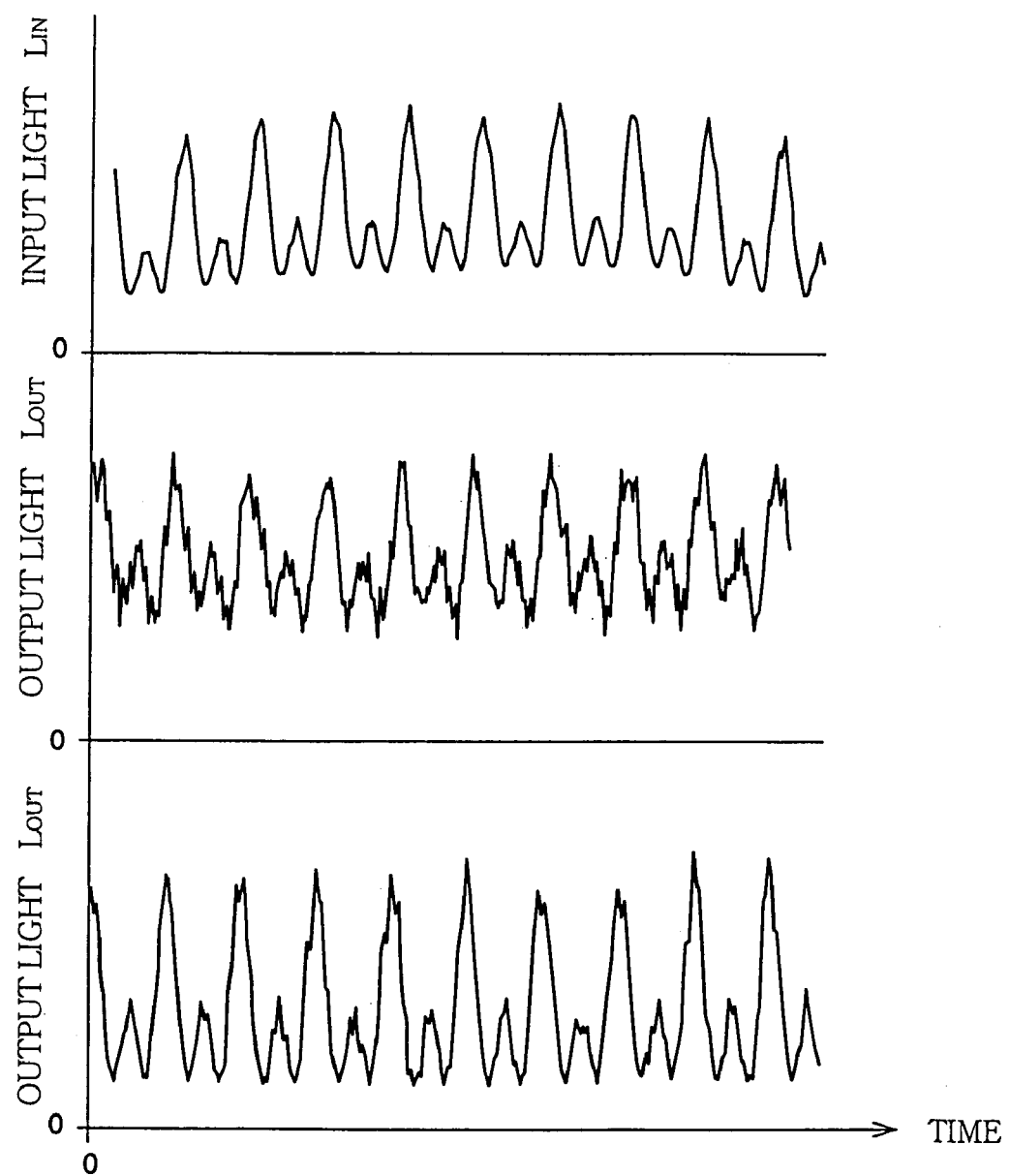
FIG. 9 is a view explaining an amplification operation for amplifying an input signal light of 10 GHz, wherein an upper part of the view indicates a waveform of the input signal light, a middle part of the view indicates a waveform of an output signal light from the one-step-type optical signal amplification device without a negative feedback arrangement, and a lower part of the view indicates a waveform of an output signal light from the optical signal amplification device of the embodiment of FIG. 6 with a negative feedback arrangement.

There will be described waveforms of the input signal light $L_{IN}$ and the output signal light $L_{OUT}$ in a part of an experiment which was conducted by the present invention, i.e., in a case where the singe optical amplifying element 14 was used without feeding back the neighboring light $L_S$ and in a case where the above-described optical signal amplification device 42 feeding back the neighboring light $L_S$ was used. FIG. 7 is a view showing waveforms in amplification operations for amplifying the input signal light $L_{IN}$ of 0.1 GHz. FIG. 8 is a view showing waveforms in amplification operations for amplifying the input signal light $L_{IN}$ of 1 GHz. FIG. 9 is a view showing waveforms in amplification operations for amplifying the input signal light $L_{IN}$ of 10 GHz. An upper part of each of the views of FIGS. 7–9 shows the waveform of the input signal light $L_{IN}$. A middle part of each of the views of FIGS. 7–9 shows the waveform of an output signal light $L_{OUT}$ in the case where the single optical amplifying element 14 was used without feeding back the neighboring light $L_S$. A lower part of each of the views of FIGS. 7–9 shows the waveform of an output signal light $L_{OUT}$ in the case where the above-described optical signal amplification device 42 feeding back the neighboring light $L_S$ was used. As is apparent from FIGS. 7–9, the output signal light $L_{OUT}$ was given a more stable gain, a higher modulation factor M, a waveform with a higher fidelity and a more stable baseline in the case where the optical signal amplification device 42 feeding back the neighboring light $L_S$ was used, than in the case where the single optical amplifying element 14 was used without feeding back the neighboring light $L_S$. It is noted that the modulation factor M (%) is defined as $M=100\times(V_1-V_2)/(V_1+V_2)$, where $V_1$ represents a higher peak value of the signal waveform (maximum value of the signal voltage) while $V_2$ represents a lower peak value of the signal waveform (minimum value of the signal voltage). It is also noted that the amplification factor (ratio) A (decibel: dB) is defined as $A=10\log_{10}(P_{OUT}/P_{IN})$, where $P_{IN}$ represents a signal power (electric power) of the input signal light $L_{IN}$, while $P_{OUT}$ represents a signal power (electric power) of the output signal light $L_{OUT}$.

Figure 10:
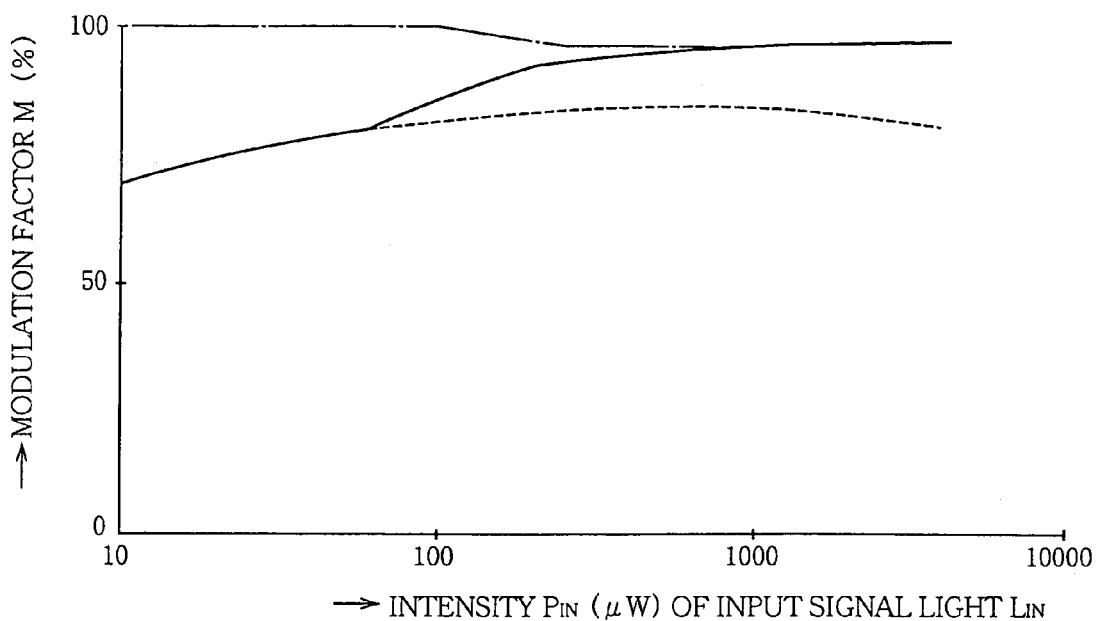
FIG. 10 is a view indicating a characteristic as to change of modulation factor M in relation with intensity $P_{IN}$ of the input signal light in each of the optical signal amplification devices of FIGS. 1 and 6, as contrasted with that in the one-step-type optical signal amplification device without a negative feedback arrangement.
Figure 11:
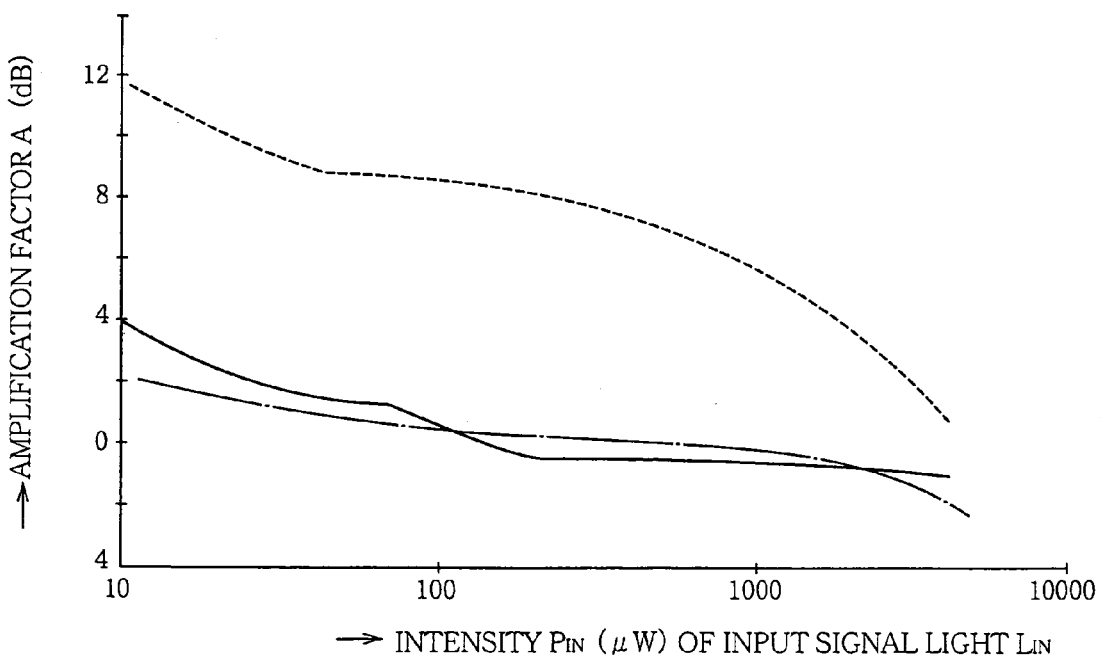
FIG. 11 is a view indicating a characteristic as to change of amplification factor A in relation with intensity $P_{IN}$ of the input signal light in each of the optical signal amplification devices of FIGS. 1 and 6, as contrasted with that in the one-step-type optical signal amplification device without a negative feedback arrangement.
Figure 12:
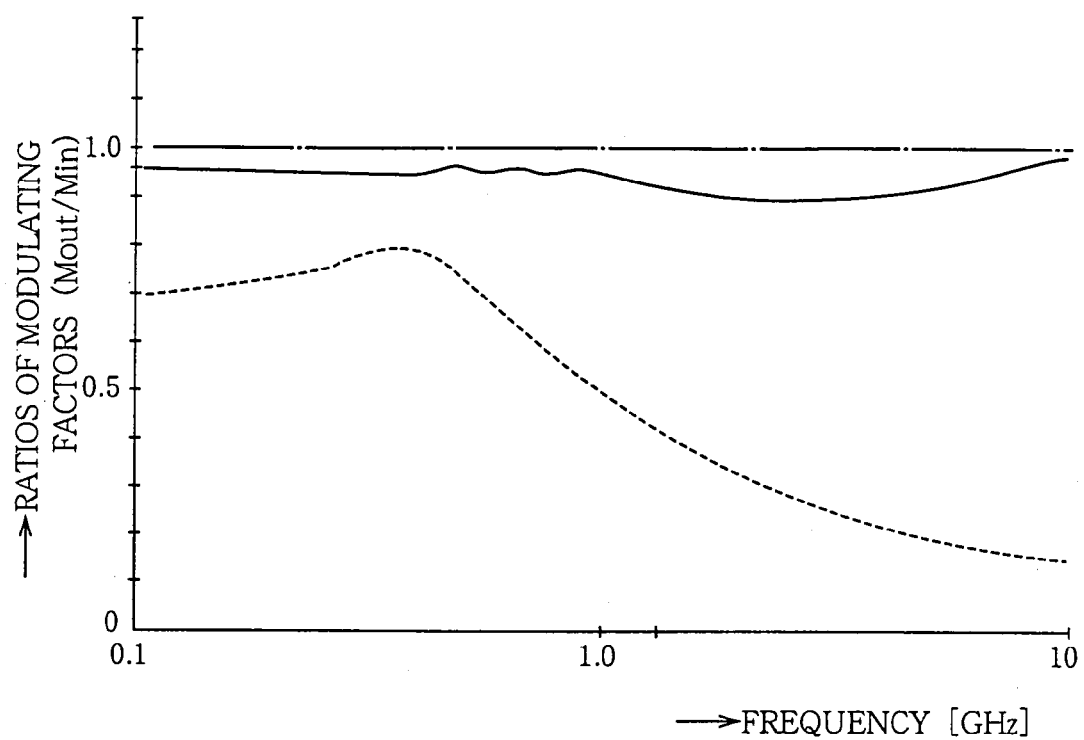
FIG. 12 is a view indicating a characteristic as to change of ratio of modulation factors in relation with frequency of the input signal light in each of the optical signal amplification devices of FIGS. 1 and 6, as contrasted with that in the one-step-type optical signal amplification device without a negative feedback arrangement.

Further, in a part of the experiment conducted by the present inventor, the input signal light $L_{IN}$ was modulated at 0.5 GHz in the one-step-type optical signal amplification device 10 and the two-step-type optical signal amplification device 42. FIG. 10 shows a modulation factor characteristic, i.e., a relationship between the modulation factor and the intensity of the input signal light $L_{IN}$ in the one-step-type optical signal amplification device 10 and the two-step-type optical signal amplification device 42. FIG. 11 shows an amplification factor characteristic, i.e., a relationship between the amplification factor and the intensity of the input signal light $L_{IN}$ in the one-step-type optical signal amplification device 10 and the two-step-type optical signal amplification device 42. FIG. 12 shows a relationship between a ratio of the modulation factors ($M_{OUT}/M_{IN}$) and the frequency of the input signal light $L_{IN}$ in the one-step-type optical signal amplification device 10 and the two-step-type optical signal amplification device 42. In FIG. 10, the broken line represents the case where the single optical amplifying element 14 was used without feeding back the neighboring light $L_S$, the solid line represents the case where the one-step-type optical signal amplification device 10 was used, and the one-dot chain line represents the case where the two-step-type optical signal amplification device 42 was used. As is apparent from FIG. 10, the modulation factor M in the one-step-type optical signal amplification device 10 and the two-step-type optical signal amplification device 42 is remarkably improved over that in the case where the single optical amplifying element 14 was used without feeding back the neighboring light $L_S$. In this instance, until the intensity of the input signal light $L_{IN}$ reaches up to about 100 μW, there was no difference between the solid line representative of the case where the one-step-type optical signal amplification device 10 was used, and the broken line representative of the case where the single optical amplifying element 14 was used without feeding back the neighboring light $L_S$. That is, the advantage of the negative feedback effect is not clearly confirmed while the intensity of the input signal light $L_{IN}$ is not higher than about 100 μW. On the other hand, in the case of use of the optical signal amplification device 42 in which the intensity of the neighboring light $L_S$ is amplified by the second optical amplifying element before the neighboring light $L_S$ is inputted to the first optical amplifying element 14, the advantage of the negative feedback effect is remarkable. This is because the negative feedback effect is not sufficiently obtained in the first optical amplifying element 14 since the intensity of the feed back neighboring light $L_S$ is too low. Namely, this is because the phenomenon of the cross gain modulation inherently occurs where the intensity of the input light is high. It is therefore considered that the neighboring light $L_S$ whose signal is inverted is not given a sufficiently high intensity while the intensity of the input signal light $L_{IN}$ is not higher than about 100 μW. For compensating for such a deficiency, the intensity of the inverted neighboring light $L_S$ is amplified by the second optical amplifying element in the two-step-type optical signal amplification device 42. As a result, as shown in FIG. 10, even while the intensity of the input signal light $L_{IN}$ is low to be not higher than about 100 μW, the negative feedback effect can be sufficiently obtained, and the modulation factor of near 100% is obtained in the output light. Since it is common that a light signal having an intensity of not higher than 100 μW is used in a standard optical communication, the two-step-type optical signal amplification device 42 of the present embodiment exhibits a satisfactory performance, where there is a possibility that the one-step-type optical signal amplification device 10 does not exhibits a satisfactory performance.

Further, in FIG. 11, the broken line represents the case where the single optical amplifying element 14 was used without feeding back the neighboring light $L_S$, the solid line represents the case where the one-step-type optical signal amplification device 10 was used, and the one-dot chain line represents the case where the two-step-type optical signal amplification device 42 was used. As is apparent from FIG. 11, the amplification factor A in the one-step-type optical signal amplification device 10 and the two-step-type optical signal amplification device 42 is suppressed to be lower than that in the case where the single optical amplifying element 14 was used without feeding back the neighboring light $L_S$. However, the signal waveform in the cases of the optical signal amplification devices 10, 42 is remarkably improved over the characteristic of the waveform in the prior art. That is, noise reduction is realized. Further, each of the optical signal amplification devices 10, 42 has a characteristic according to which the amplification factor is further suppressed with an increase in the intensity of the input signal light $L_{IN}$. Owing to this characteristic, the intensity $P_{OUT}$ of the output signal light $L_{OUT}$ is rapidly reduced if the input signal light $L_{IN}$ having a relatively excessively high intensity $P_{IN}$ (1000 μW or higher) is inputted thereto. Therefore, each of the optical signal amplification devices 10, 42 is capable of constituting an optical limiter or a light surge suppressor.

Further, in FIG. 12, the broken line represents the case where an one-step-type optical signal amplification device in which the neighboring light $L_S$ is not subjected to a feedback (negative feedback) was used, the solid line represents the case where the one-step-type optical signal amplification device 10 in which the neighboring light $L_S$ is subjected to the feedback was used, and the one-dot chain line represents the case where the two-step-type optical signal amplification device 42 was used. As is apparent from FIG. 12, in the one-step-type optical signal amplification device in which the neighboring light $L_S$ is not subjected to the feedback (negative feedback), the ratio of the modulation factors ($M_{OUT}/M_{IN}$) (i.e., the ratio of the modulation factor $M_{OUT}$ of the output signal light $L_{OUT}$ to the modulation factor $M_{IN}$ of the input signal light $L_{IN}$) is relatively low and is considerably lowered when the frequency of the input signal light $L_{IN}$ becomes to be equal to or higher than 3 GHz. On the other hand, in the one-step-type optical signal amplification device 10 and the two-step-type optical signal amplification device 42, the ratio of the modulation factors ($M_{OUT}/M_{IN}$) is substantially in the neighborhood of one in all the frequency band. It is apparent from FIG. 12 that distortion of the waveform is extremely small in the high and wide frequency band of 0.1–10 GHz, and that the two-step-type optical signal amplification device 42 has remarkably excellent characteristics.

Embodiment 4

Figure 13:
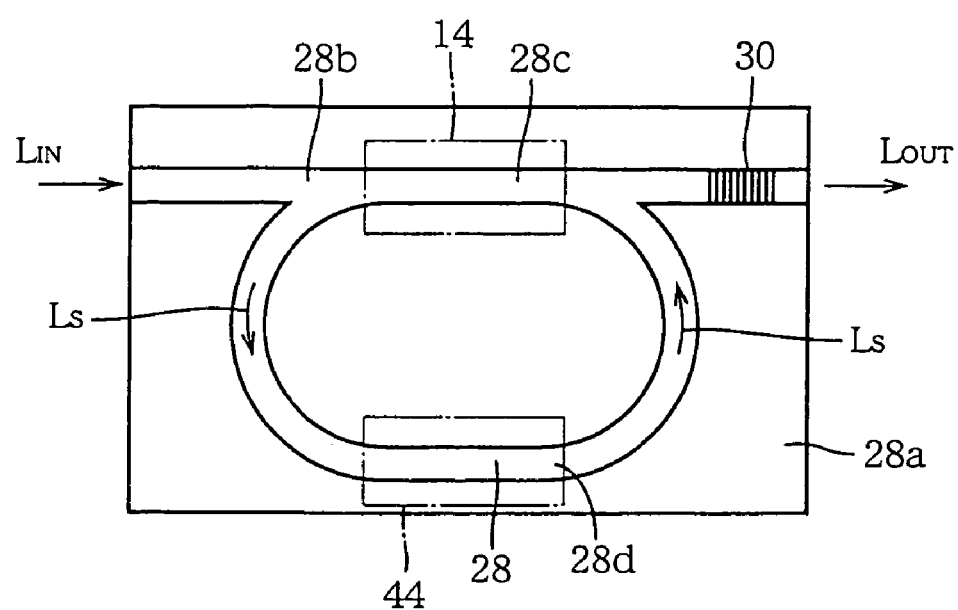
FIG. 13 is a view explaining an example in which the optical signal amplification device of the embodiment of FIG. 6 is monolithically integrated into a monolithic semiconductor.

FIG. 13 shows a monolithic arrangement as another example in which the above-described optical signal amplification device 42 is mounted on a single semiconductor chip. In FIG. 13, on a semiconductor substrate 28a, there is formed a waveguide 28b, which consists of a straight portion and an elliptic portion that overlaps with a central part of the straight portion so as to be connected with the straight portion. Upper electrodes 28c, 28d are provided in respective portions of the waveguide 28b, which portions correspond to the central part of the straight portion and parts of the elliptic portion, so as to function as the above-described first and second optical amplifying elements 14, 44, respectively. A wavelength selecting element 30, having a refractive index which is periodically changed, is provided in the output side part of the straight portion of the waveguide 28b. Like the above-described wavelength selecting element 12, the wavelength selecting element 30 extracts an output signal light $L_{OUT}$ of a first wavelength $\lambda_1$ (e.g., 1550 nm) and a neighboring light $L_S$ of a wavelength other than the first wavelength $\lambda_1$, from an output light outputted from the first optical amplifying element 14, and then permits the output signal light $L_{OUT}$ to be transmitted therethrough, while reflecting the neighboring light $L_S$. The reflected neighboring light $L_S$ is fed back toward the first optical amplifying element 14, i.e., the input side, so as to be circulated in the elliptic portion of the waveguide 28b. The circulated neighboring light $L_S$ is inputted to the second optical amplifying element 44, so as to be amplified and then fed back to the first optical amplifying element 14. In the present embodiment, the straight portion of the waveguide 28b functions as signal light inputting means (first inputting means) for inputting an input signal light $L_{IN}$ to the first optical amplifying element 14, while the elliptic portion of the waveguide 28b functions as optical feedback means (second inputting means) for permitting the neighboring light $L_S$ which has been separated by the wavelength selecting element 30, to be fed back to be inputted to the first optical amplifying element 14.

Embodiment 5

Figure 14:
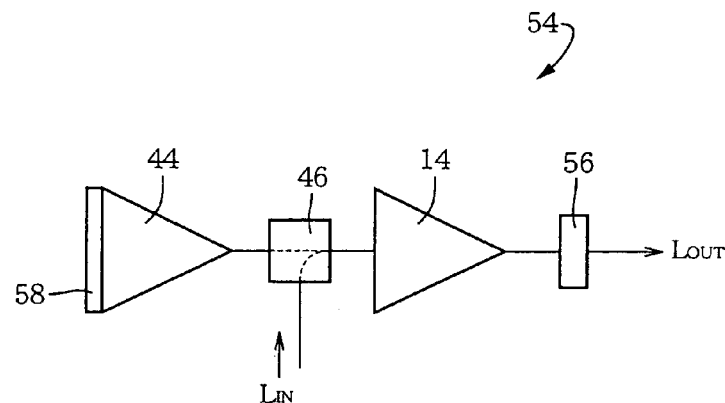
FIG. 14 is a block diagram corresponding to the block diagram of FIG. 6, and explaining a circuit arrangement of a two-step-type optical signal amplification device according to another embodiment of the present invention.
Figure 15:
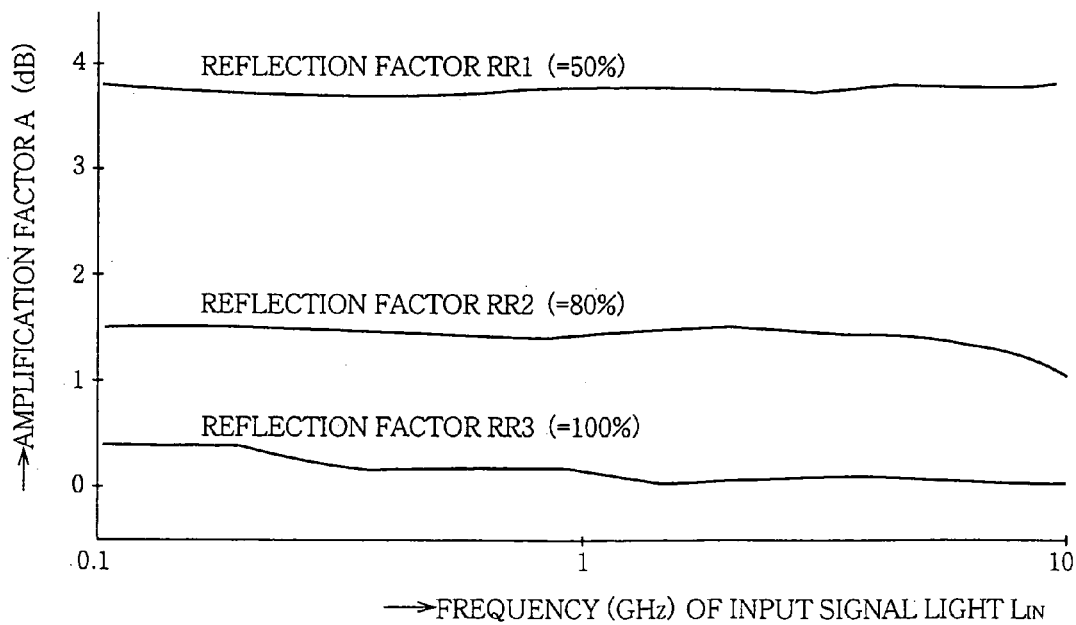
FIG. 15 is a view indicating a characteristic as to change of amplification factor A in relation with frequency of the input signal light in the optical signal amplification device of the embodiment of FIG. 14, where reflectance of reflecting means is changed.

A two-step-type optical signal amplification device 54 of FIG. 14 is a modification of the two-step-type optical signal amplification device 42 of FIG. 6. This two-step-type optical signal amplification device 54 is different from the two-step-type optical signal amplification device 42 in that the wavelength selecting element 12 is replaced by a wavelength selecting element 56 which is equipped with a characteristic to permit an output signal light $L_{OUT}$ of a first wavelength $\lambda_1$ included in the output light of the first optical amplifying element 14, to be transmitted therethrough, while reflecting a neighboring light $L_S$ which has been separated from the output signal light $L_{OUT}$, toward the first optical amplifying element 14, in that the optical feedback path is eliminated, and in that reflecting means 58 such as a mirror is integrally provided in the input side of the second optical amplifying element 44. In the present embodiment, the neighboring light $L_S$ having an intensity inverted by the cross gain modulation of the first optical amplifying element 14 is reflected by the wavelength selecting element 56, and regresses along the optical path. The neighboring light $L_S$ having regressed is reflected by the reflecting means 58, and is then amplified by the second optical amplifying element 44, before reaching the first optical amplifying element 14 again. The negative feedback amplification effect is generated by incidence of the neighboring light $L_S$ onto the first optical amplifying element 14. In the present embodiment, it is possible to obtain the same effect as in the two-step-type optical signal amplification device 42 of FIG. 6, and also to change the negative feedback effect, i.e., an amount by which the neighboring light $L_S$ is negatively fed back. The negative feedback effect or negative feedback amount can be changed by adjusting a reflection factor of the reflecting means 58. As shown in FIG. 15 by way of example, it is possible to obtain desired values of amplification factor A, each of which is constant irrespective of frequency of the input signal light $L_{IN}$. In FIG. 15, the reflection factor RR of the reflecting means 58 is used as a parameter that is placed in three different levels, i.e., RR1 (=50%), RR2 (=80%), RR3 (=100%), wherein RR1<RR2<RR3. The negative feedback amount is increased with an increase in the reflection factor RR of the reflecting means 58, and accordingly the increase in the reflection factor RR of the reflecting means 58 leads to a reduction in the amplification factor. In the present embodiment, the optical coupler 46 functions as signal light inputting means (first inputting means) for inputting the input signal light $L_{IN}$ to the first optical amplifying element 14, while the reflecting means 58 functions as optical feedback means (second inputting means) for reflecting all or a part of the neighboring light $L_S$ which has been reflected by the wavelength selecting element 56, so as to render the above-described all or part of the neighboring light $L_S$ to be fed back to be inputted to the first optical amplifying element 14. It is noted that the second optical amplifying element 44 and the reflecting means 58 may be constituted independently of each other, although the second optical amplifying element 44 and the reflecting means 58 are integrated with each other to constitute a reflection-type amplifier in the present embodiment.

Embodiment 6

Figure 16:
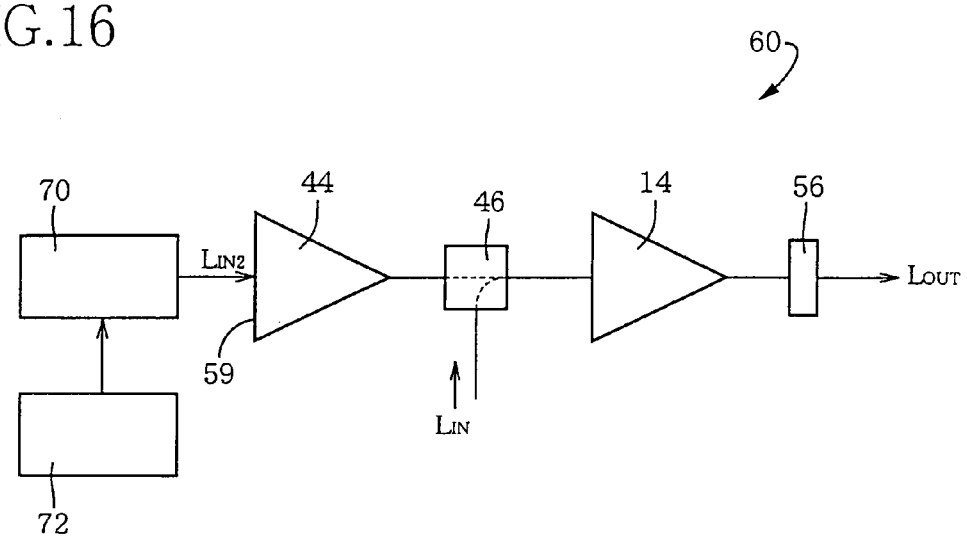
FIG. 16 is a block diagram corresponding to the block diagram of FIG. 6, and explaining a circuit arrangement of a two-step-type optical signal amplification device according to another embodiment of the present invention.
Figure 17:
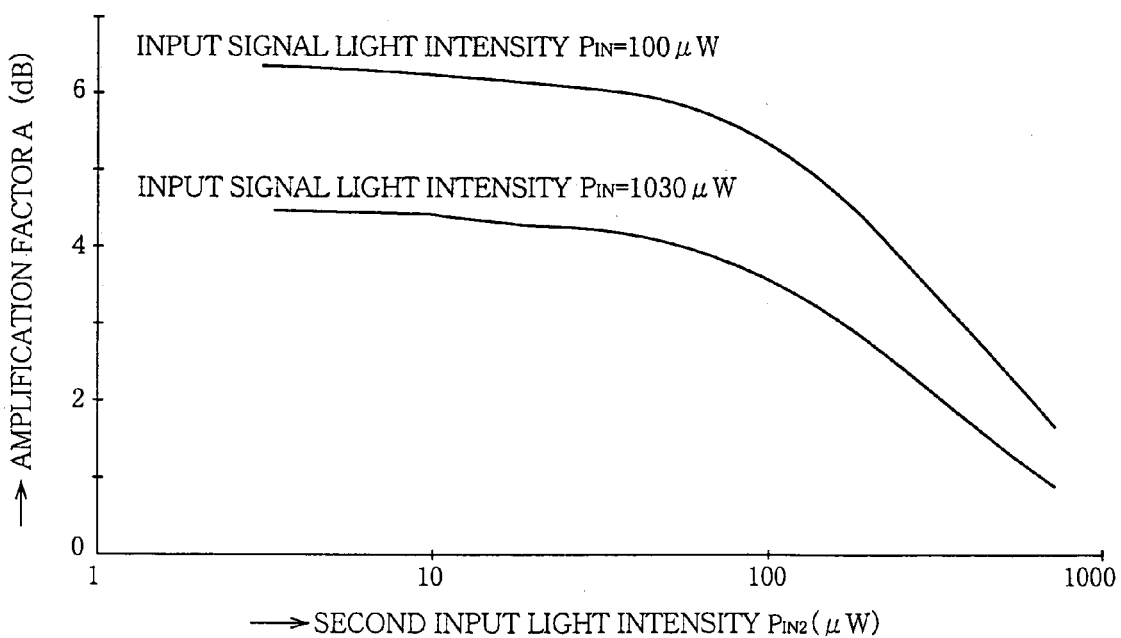
FIG. 17 is a view indicating a characteristic as to change of amplification factor A in relation with intensity of the second input light in the optical signal amplification device of the embodiment of FIG. 16.
Figure 18:
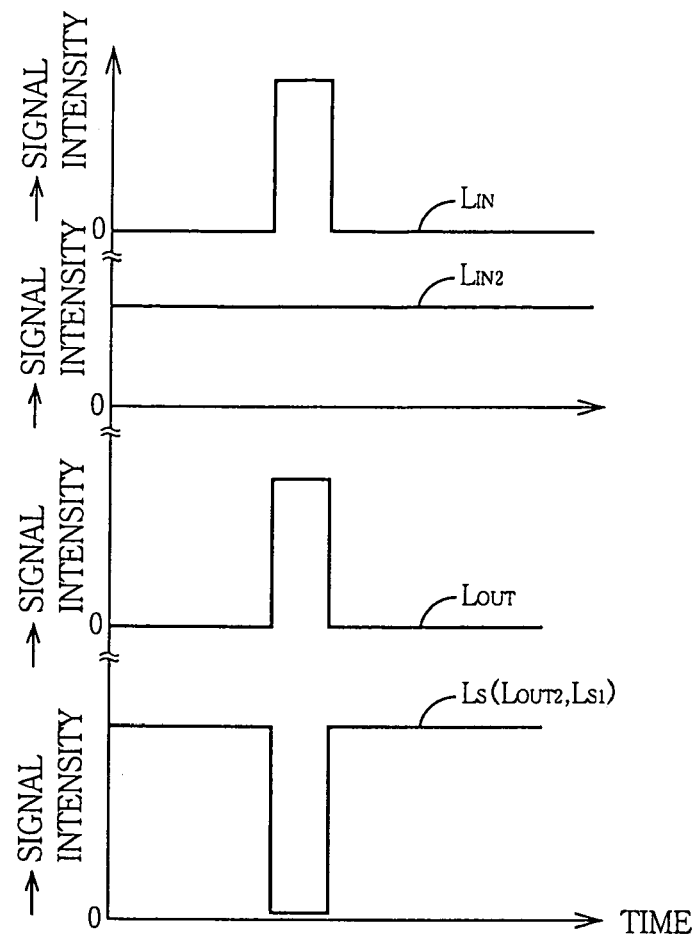
FIG. 18 is a time chart explaining an operation of the optical signal amplification device of the embodiment of FIG. 16, by using waveforms.
Figure 19:
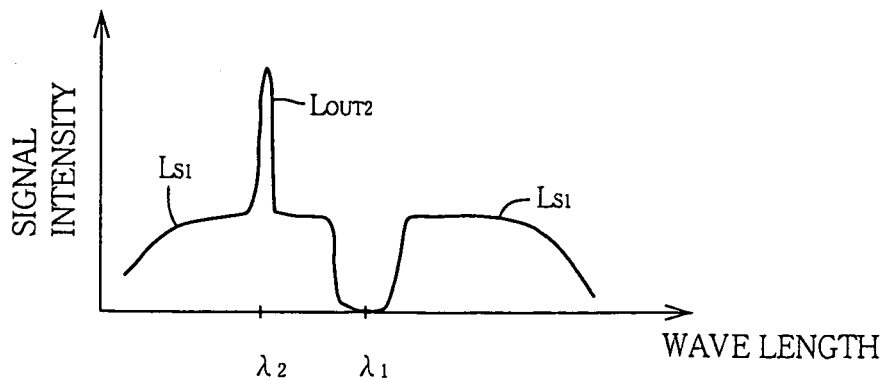
FIG. 19 is a view showing spectrum of a neighboring light outputted from a second semiconductor optical amplifying element, for explaining the operation of the optical signal amplification device of the embodiment of FIG. 16.

A two-step-type optical signal amplification device 60 of FIG. 16 is a modification of the two-step-type optical signal amplification device 54 of FIG. 14. FIG. 17 indicates a characteristic amplification factor A in the optical signal amplification device 60. This optical signal amplification device 60 is different from the above-described two-step-type optical signal amplification device 54 in that a second input light $L_{IN2}$ is inputted to the second optical amplifying element 44 and in that the reflecting means is provided by an input-side end face 59 in place of the above-described reflecting means 58 such as a mirror. The second input light $L_{IN2}$ is a monochromatic laser light having a wavelength $\lambda_2$ of, for example, 1535 nm, which is different from the first wavelength $\lambda_1$, and which is set to lie within the wavelength band of the neighboring light $L_S$. In the present embodiment, the neighboring light $L_S$, which has been reflected by the wavelength selecting element 56, regresses along the optical path, so as to be fed back to the second optical amplifying element 44. The inverted signal of the neighboring light $L_S$ is amplified by the second input light $L_{IN2}$ in the second optical amplifying element 44, so that a negative feedback light having a high intensity is injected to the first optical amplifying element 14, thereby providing a high negative feedback effect. In the present embodiment, it is possible to obtain the same effect as in the two-step-type optical signal amplification device 42 of FIG. 6. That is, in the present embodiment, as shown in FIG. 18, as the second input light $L_{IN2}$ having a constant intensity is inputted to the second optical amplifying element 44, the neighboring light $L_S$ having a relatively high intensity which is inverted with respect to the output signal light $L_{OUT}$ of the first wavelength $\lambda_1$ is outputted from the second optical amplifying element 44. Then, the neighboring light $L_S$ having the relatively high intensity and the input signal light $L_{IN}$ of the first wavelength $\lambda_1$ are inputted to the first semiconductor optical amplifying element 14, whereby a second output signal light $L_{OUT2}$ and a neighboring light $L_{S1}$, which is to be fed back, are obtained. In the present embodiment, the input signal light $L_{IN}$ and the second output signal light $L_{OUT2}$ are inputted into the first semiconductor optical amplifying element 14 through the optical coupler 46, whereby the negative feedback effect is sufficiently obtained, and the output signal light $L_{OUT}$ is eventually outputted. In the optical signal amplification device 60 of the present embodiment, the second input light $L_{IN2}$, which is inputted to the second optical amplifying element 44, is the monochromatic laser light having the constant intensity and the wavelength $\lambda_2$ of, for example, 1535 nm, which is different from the first wavelength $\lambda_1$, and which is set to lie within the wavelength band of the neighboring light $L_S$, as described above. As a result, the neighboring light $L_S$ including the second output signal light $L_{OUT2}$ and the neighboring light $L_{S1}$ is given an intensity and a wavelength as presented by a spectrum of FIG. 19, so that the obtained negative feedback effect is stabilized owing to the feedback of the neighboring light $L_S$ having the relatively high intensity. Further, there is an advantage that the second optical amplifying element 44 outputs the second output signal light $L_{OUT2}$ which can be utilized as an inverted output of a relatively high intensity.

As shown in FIG. 17, the optical signal amplification device 60 has a characteristic that the amplification factor A is reduced with an increase in the output intensity of a laser light source 70. Therefore, by adjusting the intensity of the second input light $L_{IN2}$ incident onto the second optical amplifying element 44, namely, by adjusting the output of the laser light source 70 with operation of an output setter 72, the negative feedback amount of the neighboring light $L_S$, i.e., the negative feedback effect can be changed whereby a desired amplification factor A can be obtained. The negative feedback amount is increased with an increase in an incident intensity $P_{IN2}$ of the second input light $L_{IN2}$, whereby the amplification factor A can be reduced. In FIG. 17, an incident intensity $P_{IN}$ of the first input signal light $L_{IN}$ is used a parameter that is placed in two different levels, i.e., a relatively low incident intensity $P_{IN}$ (=100 μW) and a relatively high incident intensity $P_{IN}$ (=1030 μW), and the negative feedback amount is increased with an increase in an incident intensity $P_{IN2}$ of the second input light $L_{IN2}$, whereby the amplification factor A is reduced. In the present embodiment, the optical coupler 46 functions as signal light inputting means (first inputting means) for inputting the input signal light $L_{IN}$ to the first optical amplifying element 14, while the end face 59 of the second optical amplifying element 44 functions as optical feedback means (second inputting means) for reflecting all or a part of the neighboring light $L_S$ which has been reflected by the wavelength selecting element 56, so as to render the above-described all or part of the neighboring light $L_S$ to be fed back to be inputted to the first optical amplifying element 14.

Embodiment 7

Figure 20:
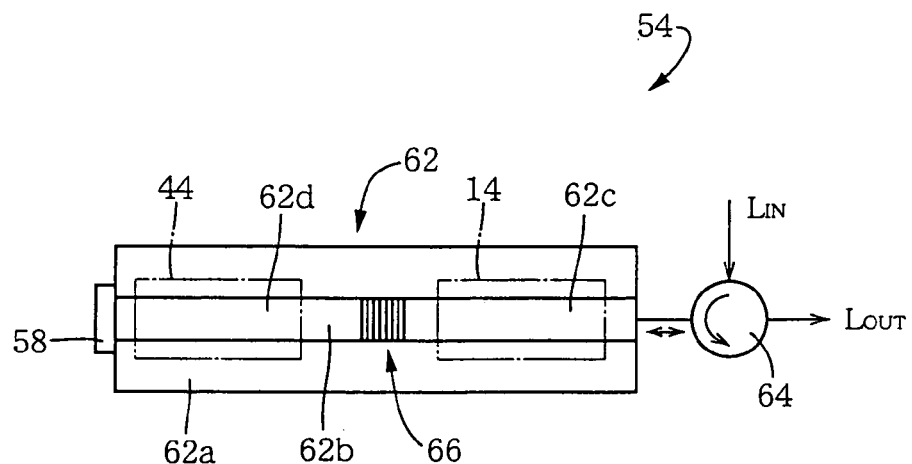
FIG. 20 is a view explaining an example in which the optical signal amplification device of the embodiment of FIG. 14 is monolithically integrated into a monolithic semiconductor.

Both of the two-step-type optical signal amplification device 54 of FIG. 14 and the two-step-type optical signal amplification device 60 of FIG. 16 can be monolithically arranged. FIG. 20 shows an example in which the optical signal amplification device 54 is constituted by a single semiconductor chip 62 and an optical circulator 64. In FIG. 20, a linear waveguide 62b is formed on a semiconductor substrate 62a, wherein upper electrodes 62c and 62d are provided on a portion of the waveguide 62b close to the optical circulator 64 and on a portion of the waveguide 62b remote from the optical circulator 64, respectively. The upper electrodes 62c and 62d function as the first and second optical amplifying elements 14 and 44, respectively. Between portions of the rectangular waveguide 62a corresponding to the respective first and second optical amplifying elements 14 and 44, there is provided a grating filter 66, which is adapted to reflect a light of the first wavelength $\lambda_1$ and permits a light of the other wavelength to be transmitted therethrough. This grating filter 66 is constructed to reflect the light of a wavelength band of 1545–1555 nm (whose central value is 1550 nm) and permits the light of the other wavelength. No element is provided on one of opposite end faces of the waveguide 62b which is close to the optical circulator 64, while the reflecting means 58 such as a mirror is fixedly provided on the other end face. The reflecting means 58 does not have be necessarily provided, since the end face of the waveguide 62b has a certain degree of reflection factor and is accordingly capable of functioning as reflecting means. In the present embodiment, the input signal light $L_{IN}$ inputted to the optical circulator 64 is inputted to the first optical amplifying element 14, so that the neighboring light $L_S$ having the inverted intensity and the output signal light $L_{OUT}$ of the first wavelength $\lambda_1$ (e.g., 1550 nm) are generated by the cross gain modulation in the first optical amplifying element 14. The output signal light $L_{OUT}$ of the first wavelength $\lambda_1$ is reflected by the grating filter 66 and is then outputted via the first optical amplifying element 14 and the optical circulator 64. Meanwhile, the neighboring light $L_S$ is transmitted through the grating filter 66 and the second optical amplifying element 44 and is then reflected by the reflecting means 58 so as to reach the first optical amplifying element 14 again. In this instance, after being amplified by the second optical amplifying element 44, the neighboring light $L_S$ is injected to the first optical amplifying element 14, so that the negative feedback effect is generated thereby making it possible to obtain the same effect as in the optical signal amplification device 42. In the present embodiment, the optical circulator 64 and the grating filter 66 function as signal light inputting means (first inputting means) for inputting the input signal light $L_{IN}$ to the first optical amplifying element 14, while the reflecting means 58 functions as optical feedback means (second inputting means) for reflecting all or a part of the neighboring light $L_S$ which has been selectively transmitted through the grating filter 66, so as to render the above-described all or part of the neighboring light $L_S$ to be fed back to be inputted to the first optical amplifying element 14. It is noted that a modification of the embodiment of FIG. 20 in which the reflecting means 58 is removed corresponds to an example in which the two-step-type optical signal amplification device 60 of FIG. 16 is monolithically arranged.

Embodiment 8

Figure 21:
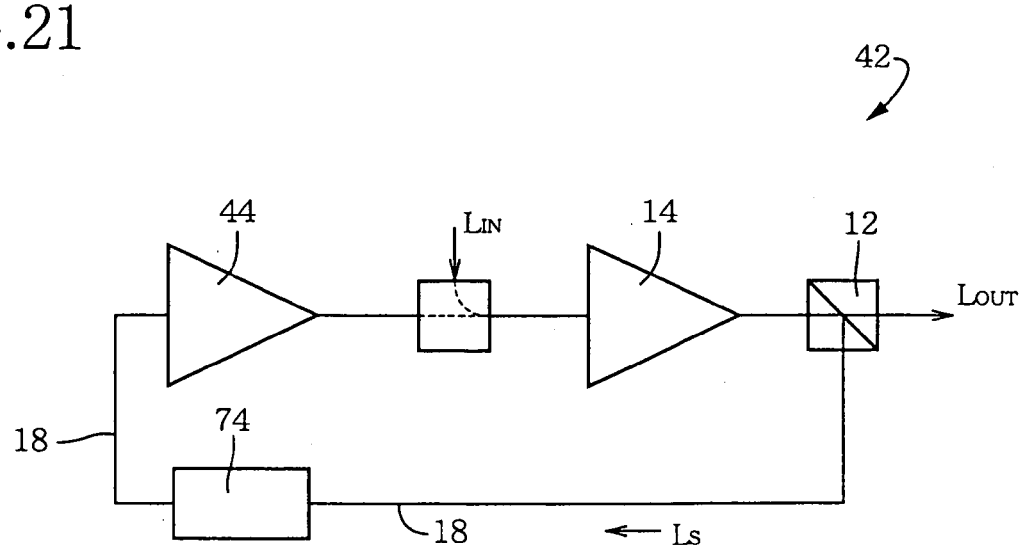
FIG. 21 is a view explaining an example in which an amplification-factor varying function is provided in the optical signal amplification device of FIG. 6.

FIG. 21 shows an example in which the two-step-type optical signal amplification device 42 of FIG. 6 is constructed to be of an amplification-factor variable type. In the optical signal amplification device 42 of the present embodiment, an attenuator 74 functioning as a light-amount varying device is provided in the optical feedback path 18 which serves for inputting all or a part of the neighboring light $L_S$ to the second optical amplifying element 44. This attenuator 74 is constructed to include an optical system which renders the neighboring light $L_S$ (transmitted through the optical feedback path 18) to take the form of parallel beam having a predetermined cross sectional area, and a shielding plate which is movably provided to change a shielded area of the cross section. In the present embodiment in which the amount of the neighboring light $L_S$ inputted to the second semiconductor optical amplifying element 44 is adjusted, the amplification factor A is set to be a desired value based on change of the intensity of the neighboring light $L_S$, which is amplified by the second semiconductor optical amplifying element 44 and is then supplied to the first semiconductor optical amplifying element 14.

Embodiment 9

Figure 22:
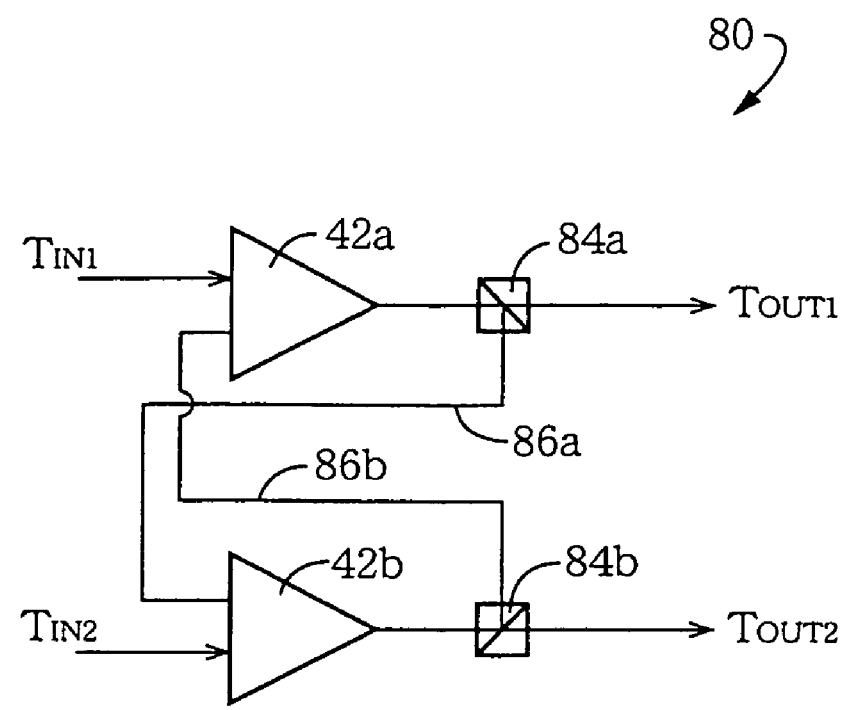
FIG. 22 is a view explaining an example of arrangement of an optical flip-flop circuit using the optical signal amplification device of FIG. 6.

Further, it is possible to constitute an optical flip-flop circuit, by using any one of the above-described optical signal amplification devices 10, 42, 54, 60. An optical flip-flop circuit 80, which is shown in FIG. 22 by way of example, is constituted by the optical signal amplification device 42 of FIG. 6. This optical flip-flop circuit 80 is equipped with: first and second optical signal amplification devices 42a, 42b to which a first input signal light $T_{IN1}$ of a first wavelength $\lambda_1$ and a second input signal light $T_{IN2}$ of a second wavelength $\lambda_2$ are successively inputted, respectively; first and second optical branching filters 84a, 84b which separate a first output signal light $T_{OUT1}$ of the first wavelength $\lambda_1$ and a second output signal light $T_{OUT2}$ of the second wavelength $\lambda_2$ from respective output lights of the first and second optical signal amplification devices 42a, 42b; a first optical intersecting path 86a through which a part of the first output signal light $T_{OUT1}$ branched by the first optical branching filter 84a is inputted to the second optical signal amplification device 42b; and a second optical intersecting path 86b through which a part of the second output signal light $T_{OUT2}$ branched by the second optical branching filter 84b is inputted to the first optical signal amplification device 42a. In the thus constructed optical flip-flop circuit 80 in which the first input signal light $T_{IN1}$ and the second input signal light $T_{IN2}$ are being successively inputted to the pair of optical signal amplification devices 42a, 42b, respectively, if the first input signal light $T_{IN1}$ is placed in its OFF state, the first output signal light $T_{OUT1}$ is switched from its intermediate state to its OFF state while at the same time the second output signal light $T_{OUT2}$ (outputted from the second optical signal amplification device 42b to which the first output signal light $T_{OUT1}$ is inputted) is switched from its intermediate state to its ON state. This ON state of the second output signal light $T_{OUT2}$ is maintained even after the first input signal light $T_{IN1}$ is restored to its original state in which the first input signal light $T_{IN1}$ is successively inputted to the first optical signal amplification device 42a. Subsequently, if the second input signal light $T_{IN2}$ of the second wavelength $\lambda_2$ is placed in its OFF state, the second output signal light $T_{OUT2}$ is placed in its OFF state while at the same time the first output signal light $T_{OUT1}$ is switched from its OFF state to its ON state. This ON state of the first output signal light $T_{OUT1}$ is maintained even after the second input signal light $T_{IN2}$ is restored to its original state in which the second input signal light $T_{IN2}$ is successively inputted to the second optical signal amplification device 42b. Thus, the first input signal light $T_{IN1}$ and the second input signal light $T_{IN2}$ are alternately placed in their respective OFF states, so that the first or second output signal light $T_{OUT1}$ or $T_{OUT2}$ is switched from its ON state to its OFF state or vice versa each time the first or second input signal light $T_{IN1}$ or $T_{IN2}$ is placed in its OFF state.

While the embodiments of the present invention have been described above by reference to the drawings, the present invention can be applied to otherwise embodied forms.

For instance, the above-described first optical amplifying element 14 may be constituted by an optical fiber amplifier (EDFA) which includes erbium element, or may be an optical fiber amplifier doped with a praseodymium, as long as the optical amplifying element is given the cross gain modulation characteristic. Further, the second optical amplifying element 44 may be an optical fiber amplifier, as long as the optical amplifying element is given the cross gain modulation characteristic.

Further, each of the wavelength selecting elements 12, 24b, 30, 50b, 56 of the above-described embodiments may be constituted by an optical add/drop filter. Further, each of the couplers 16, 36 may be constituted by an optical circulator or a directional coupling element.

The embodiments of the present invention have been described in detail by reference to the drawings. However, what have been described above are merely the embodiments of the invention. The present invention can be embodied with various modifications and improvements based on knowledge of those skilled in the art.

The invention claimed is:

1. An optical signal amplification device for outputting an output signal light which has a first wavelength that is the same as a wavelength of an input signal light and an intensity variation that is identical in phase with an intensity variation of the input signal light, said optical signal amplification device comprising:
    a first optical amplifying element having a mutual gain modulation function of outputting an output light including (i) the output signal light and (ii) a neighboring light which has a neighboring wavelength that is different from the wavelength of the output signal light and an intensity variation that is inverted in phase with respect to the intensity variation of the output signal light;
    signal-light inputting means inputting only the input signal light to said first optical amplifying element;
    a wavelength-selecting element extracting the output signal light of the first wavelength and at least a part of the neighboring light of the wavelength different from the first wavelength, from the output light outputted from said first optical amplifying element, such that the output signal light and said at least a part of the neighboring light are separated from each other; and
    optical feedback means for feeding back said at least a part of the neighboring light extracted by said wavelength-selecting element, to said first optical amplifying element, so that said at least a part of the neighboring light is inputted to said first optical amplifying element, for rendering said first optical amplifying element to generate a negative feedback amplification effect.

2. An optical signal amplification device for outputting an output signal light which has a first wavelength that is the same as a wavelength of an input signal light and an intensity variation that is identical in phase with an intensity variation of the input signal light, said optical signal amplification device comprising:
    a first optical amplifying element having a cross gain modulation function of outputting an output light including (i) the output signal light and (ii) a neighboring light which has a neighboring wavelength that is different from the wavelength of the output signal light and an intensity variation that is inverted in phase with respect to the intensity variation of the output signal light;
    signal-light inputting means for inputting the input signal light to said first optical amplifying element;
    a wavelength-selecting element extracting the output signal light of the first wavelength and at least a part of the neighboring light of the wavelength different from the first wavelength, from the output light outputted from said first optical amplifying element, such that the output signal light and said at least a part of the neighboring light are separated from each other;
    a second optical amplifying element amplifying said at least a part of the neighboring light extracted by said wavelength-selecting element; and
    optical feedback means for feeding back said at least a part of the neighboring light amplified by said second optical amplifying element, to said first optical amplifying element, so that said at least a part of the neighboring light is inputted to said first optical amplifying element, for rendering said first optical amplifying element to generate a negative feedback amplification effect.

3. An optical signal amplification device according to claim 1, further comprising amplification-factor controlling means for controlling an amplification factor of the output signal light by controlling an amount of said at least a part of the neighboring light which is to be fed back to said first optical amplifying element.

4. An optical signal amplification device according to claim 2, further comprising second input-light inputting means for inputting a second input light which has a wavelength that is different from the first wavelength, to said second optical amplifying element, for enhancing the negative feedback amplification effect of said first optical amplifying element.

5. An optical signal amplification device according to claim 2, further comprising amplification-factor controlling means for controlling an amplification factor of the optical signal amplification device by controlling an intensity of a second input light which is inputted to said second optical amplifying element.

6. An optical signal amplification device according to claim 1, wherein said wavelength-selecting element is constituted by one of a grating filter having a refractive index which is periodically changed in a light transmission direction, a multilayer filter consisting of a multiplicity of pairs of layers which are superposed on each other and in which each pair of layers have respective different refractive index values, and a photonic crystal filter.

7. An optical signal amplification device according to claim 1, wherein each of at least one of said signal-light inputting means and said optical feedback means is constituted by at least one of an optical coupler, an optical circulator, a directional coupling element, an optical add/drop filter and a wavelength selecting element.

8. An optical signal amplification device according to claim 1,
wherein said first optical amplifying element is a semiconductor optical amplifying element equipped with an active layer constituted by pn junction,
and wherein said active layer is constituted by at least one of a bulk, a multiplex quantum well, a strained superlattice and a quantum dot.

9. An optical signal amplification device according to claim 8, wherein each of at least one of said first optical amplifying element and said second optical amplifying element is a reflection-type semiconductor optical amplifying element which is equipped at an end portion thereof with reflecting means.

10. An optical signal amplification device according to claim 8, wherein said first and second optical amplifying elements, and at least one of said wavelength-selecting element, said signal-light inputting means and said optical feedback means are disposed on an optical waveguide which is formed on a monolithic semiconductor substrate.

11. An optical signal amplification device according to claim 1, constituting at least one of an optical operational amplifier, an optical differential amplification circuit, an optical adding/subtracting circuit, an optical differentiating/integrating circuit, an optical flip-flop circuit, an optical limiter and a light surge suppressor.

12. An optical signal amplification device according to claim 2, further comprising amplification-factor controlling means for controlling an amplification factor of the output signal light by controlling an amount of said at least a part of the neighboring light which is to be fed back to said first optical amplifying element.

13. An optical signal amplification device according to claim 2, wherein said wavelength-selecting element is constituted by one of a grating filter having a refractive index which is periodically changed in a light transmission direction, a multilayer filter consisting of a multiplicity of pairs of layers which are superposed on each other and in which each pair of layers have respective different refractive index values, and a photonic crystal filter.

14. An optical signal amplification device according to claim 2, wherein each of at least one of said signal-light inputting means and said optical feedback means is constituted by at least one of an optical coupler, an optical circulator, a directional coupling element, an optical add/drop filter and a wavelength selecting element.

15. An optical signal amplification device according to claim 2,
wherein each of at least one of said first optical amplifying element and said second optical amplifying element is a semiconductor optical amplifying element equipped with an active layer constituted by pn junction,
and wherein said active layer is constituted by at least one of a bulk, a multiplex quantum well, a strained superlattice and a quantum dot.

16. An optical signal amplification device according to claim 2, constituting at least one of an optical operational amplifier, an optical differential amplification circuit, an optical adding/subtracting circuit, an optical differentiating/integrating circuit, an optical flip-flop circuit, an optical limiter and a light surge suppressor.

* * * * *